(12) United States Patent
Iwasaki et al.

(10) Patent No.: US 6,180,959 B1
(45) Date of Patent: Jan. 30, 2001

(54) STATIC INDUCTION SEMICONDUCTOR DEVICE, AND DRIVING METHOD AND DRIVE CIRCUIT THEREOF

(75) Inventors: Takayuki Iwasaki; Toshiyuki Ohno; Tsutomu Yatsuo, all of Hitachi (JP)

(73) Assignee: Hitachi, Ltd., Tokyo (JP)

( * ) Notice: Under 35 U.S.C. 154(b), the term of this patent shall be extended for 0 days.

(21) Appl. No.: 09/061,145

(22) Filed: Apr. 16, 1998

(51) Int. Cl.⁷ .................. H01L 29/161; H01L 29/808
(52) U.S. Cl. .................. 257/77; 257/269; 257/273
(58) Field of Search .................. 257/264, 266, 257/274, 495, 77, 263, 265

(56) References Cited

U.S. PATENT DOCUMENTS

| | | | |
|---|---|---|---|
| 4,807,015 | 2/1989 | Kobayashi et al. | 257/77 |
| 5,559,346 | * 9/1996 | Kushida | 257/138 |
| 5,612,547 | * 3/1997 | Clarke et al. | 257/77 |
| 5,753,938 | * 5/1998 | Thapar et al. | 257/77 |
| 5,757,599 | * 5/1998 | Crane | 361/56 |
| 5,903,020 | * 5/1999 | Siergie et al. | 257/264 |

OTHER PUBLICATIONS

Kajiwara et al., "High Speed High Voltage Static Induction Thyristor", 1977 Int'l Electron Devices Meeting, Washington, D.C., pp. 38–41.

Rao et al., "Al and N Ion Implantations in 6H–SiC", Institute of Physics Conference Series, Sep. 18, 1995, pp. 521–524.

* cited by examiner

Primary Examiner—Donald L. Monin, Jr.
(74) Attorney, Agent, or Firm—Antonelli, Terry, Stout & Kraus, LLP

(57) ABSTRACT

In a silicon carbide static induction transistor, at a surface part of a semiconductor substrate, a p-type gate region is formed partially overlapping a n-type source region, whereby the high accuracy in alignment between the gate region and the source region is not required, and the gate withstand voltage can be highly increased since the substrate is made of silicon carbide, which improves the yield of static induction transistors.

22 Claims, 16 Drawing Sheets

STATIC INDUCTION SEMICONDUCTOR DEVICE, AND DRIVING METHOD AND DRIVE CIRCUIT THEREOF

BACKGROUND OF THE INVENTION

The present invention relates to a static induction semiconductor device of the type used for electrical apparatuses such as a power conversion apparatus, and a method and a drive circuit for the static induction semiconductor device.

In accordance with a need for largely increasing the power and the frequency in a power conversion apparatus, it has been desired to develop a low power loss semiconductor switching element having a high speed performance in addition to a large controllable current. To achieve such a device, the following two approaches are possible.

One of them is to further improve further the performance of a conventional semiconductor chip made of silicon, which is most widely used now, by re-examining the structure of the chip or a combination of the structure and operational mechanisms thereof. Although this approach has the advantage that is easy to improve the performance of the chip since it is possible to make use of established high level fabrication processing techniques for manufacture of a semiconductor chip and a large amount of knowledge concerning semiconductor technology, this approach has a problem in that a large improvement in the performance of the semiconductor chip can not be expected, since the performance of the chip is restricted by theoretical limits in the physical properties of silicon.

Another of the two approaches is to realize a semiconductor power chip a which the performance exceeds a performance limit of a silicon chip by far, the limit being due to the physical limits of silicon. For example, it is disclosed in a paper: "IEEE Electron Device Letters, Vol. 10, No. 10, pp. 455–457 (1989)" that the performance of a chip made of silicon carbide (hereafter referred to as SiC) is more than 1000 times of that of a silicon chip. The reason why an excellent performance of a power chip can be realized by using SiC is that the avalanche breakdown potential of SiC is high. For instance, the avalanche breakdown potential of SiC is approximately 10 times higher than that of silicon. In a paper: "IEEE Transaction of Electron Devices, Vol. 40, No. 3, pp. 645–655 (1993)", it is disclosed that the electric resistance of a drift layer in a chip made of SiC can be reduced by about two figures. Thus, a chip using SiC is regarded as a very promising chip since it can reduce power loss occurring at the time of turn-on of the semiconductor chip.

In at developing a next generation semiconductor power chip using SiC, it is desirable if the semiconductor chip is a unipolar type chip. This is because it can be expected that a large capacity device satisfying all of the three fundamental conditions of high-speed operation, a low power loss, and a voltage control device, can be realized by a unipolar type device using SiC.

A MOSFET (Metal Oxide Semiconductor Field Effect Transistor) is a typical unipolar type switching element. However, problems in a MOSFET using SiC have become clear recently. Since the mobility of electrons in an inversion layer is small in the structure of a DMOS (Double Diffusion MOS) in which a p-type base layer is formed by ion injection, it is difficult to make use of the advantage of the low resistance in a drift layer of the MOSFET. In a trench MOS structure, since the insulation ability of a trench $SiO_2$ is not sufficient, dielectric breakdown occurs at an oxide film before the avalanche breakdown of the SiC layer occurs.

Further, it is reported in a paper: "Proc. of ISPSD, pp. 119–122, May (1996)" that if the thickness of a drift layer is made thicker so that the potential at an interface between a SiC layer and an oxide film does not exceed the critical potential of the oxide film, the ON-resistance becomes very large.

Another example of a unipolar type switching element is a Static Induction Transistor (hereafter referred to as a SIT). Since a SIT is one kind of a junction-type FET, it is possible to avoid the above-mentioned problems of the low electron mobility in the interface at the oxide film and low insulation withstand voltage of the oxide film.

In the following, the structure and the operation of a SIT will be briefly explained with reference to FIG. 2. In a semiconductor substrate 200 in which a SIT shown in FIG. 2 is formed, for example, a drift region 212 is formed by growing a n-type epitaxial growth layer of a lower impurity concentration than that in a n-type drain region 211 on the upper surface of the drain region 211 of a high impurity concentration. Further, a pair of p-type gate regions 213 of a comparatively deep island shape are formed from the surface of the substrate 210 into the drift region 212, and a n-type source region 214 of a high impurity concentration are formed at the surface of the drift region 212 between the pair of gate regions 213. Furthermore, a drain terminal D, a gate terminal G, and a source terminal S, are connected to a drain electrode 225 provided on the drain region 211; a gate electrode 226 is provided on the gate regions 213; and a source electrode 227 is provided on the source region 214, respectively. At an OFF state of this SIT, a reverse bias is applied between the source and the gates, and a depletion layer extends from a p-n junction between each of the gate regions 214 and the drift region 212, mainly into the drift region 212. Therefore, a potential barrier of electrons is generated in a channel region in which current flows between the source and the drain, the channel being formed in the drift region 212 between the pair of the gate regions 213, and the voltage between the source and the drain can be blocked by the potential barrier.

In producing a SIT made of SiC, it is necessary to form more minute gates than those in a SIT made of Si in order to obtain a high blocking gain. This is due to the following two reasons. One reason is that, since thermal diffusion driving-in of dopants is difficult for SiC, a deep gate layer is hardly formed in a SiC substrate. The other reason is that, since the impurity concentration of a drift layer is high, a channel region of a depletion layer is scarcely pinched-off.

In a SIT made of SiC, while the resistance of a drift layer can be decreased, since, processing of minute gates is required, it happens that the yield of the chips decreases, or the ON resistance increases, notwithstanding the use of SiC.

As a method of reducing the ON resistance of a conventional SIT having minute gates, a method in which the ON voltage is reduced by applying a forward bias to the gates of a SIT is disclosed in a document: "IEDM Tech. Dig., pp. 676–679 (1978)". A SIT to which the above-mentioned method is applied is called a Bipolar mode SIT (hereafter referred to as BSIT). In a BSIT, by adopting a conductivity modulation method in which holes of minority carriers are injected from a gate region to a drift region, the resistance of the drift region is decreased.

While a SIT is a voltage drive type element, since a BSIT is a current drive type element, a BSIT needs a large drive power. Further, a BSIT has a problem that the turning-off time and the turning loss increase by the accumulation of the minority carriers.

SUMMARY OF THE INVENTION

A semiconductor device according to the present invention includes a silicon carbide semiconductor substrate in which silicon carbide (SiC) is mainly used. In this silicon carbide semiconductor substrate, the following regions are formed, that is, a drift region of a first conductivity type semiconductor, a source region of a first conductivity type semiconductor of which the impurity concentration is higher than that of the drift region, neighboring the drift region and extending from the surface of the silicon carbide semiconductor substrate into the substrate, and gate regions of a second conductivity type semiconductor. Moreover, a drain electrode is electrically connected to the drift region, and a source electrode and a gate electrode are in contact with the source region and the gate regions, respectively. Further, a main current flows between the drain electrode and the source electrode, and turning-on or off of the main current flow is performed by controlling the voltage applied to the gate electrode. Now then, one of main features of the present invention is that the source region is formed in contact with the gate regions.

Since the source region is formed in contact with the gate regions in the above-mentioned semiconductor device according to the present invention, a high accuracy is not required for a mask-alignment process in the patterning of these regions. Further, although the source region of a high impurity concentration is in contact with gate regions of a high impurity concentration, since those regions are mainly made of silicon carbide, a high gate withstand voltage can be obtained. Therefore, semiconductor devices having a high gate withstand voltage can be produced at a high yield.

In order to increase the voltage amplification factor $\mu$, it is preferable when the position at which the distance between a pair of the gate regions opposite to each other is minimum exists at a deeper level than the level of the bottom of the source region in the silicon carbide semiconductor substrate.

Meanwhile, it is possible to interpose a semiconductor layer of a first or second conductivity type semiconductor material of which the impurity concentration is higher than that of the drift region between the drain electrode and the drift layer. If the interposed semiconductor layer is made of a first conductivity type semiconductor material, the semiconductor device according to the present invention works as a static induction transistor (SIT), and if it is made of a second conductivity type semiconductor material, the semiconductor device according to the present invention works as a static induction thyristor (SI thyristor).

For forming the gate regions in the above-mentioned silicon carbide semiconductor device according to the present invention, it is suitable to form the gate regions by an ion injection method using ions of high energy, or under a high temperature condition. In producing a silicon carbide semiconductor device according to the present invention, a multi-layer film laminated with an organic film, an inorganic film, and a resist film, in this order, is used as a mask suitable to the ion injection method with ions of high energy. On the other hand, a multi-layer film laminated with a silicon nitride film and a metal silicide film of a high melting point, in this order, is used as a mask suitable to the ion injection method under a high temperature condition.

Meanwhile, in accordance with the present invention, the respective first and second conductivity type semiconductors correspond to either n-type semiconductor or p-type semiconductor material, of which the semiconductor characteristics are opposite to each other.

A drive method and a drive circuit of a static induction semiconductor device according to the present invention applies a forward bias, of which the level is lower than the built-in voltage at a p-n junction between a source region and each of gate regions, between the gate regions and each source region (hereafter described simply as the gate and the source).

Since the width of a depletion layer generated at a junction between a drift region of a first conductivity type semiconductor and each gate region of a second conductivity type semiconductor is decreased by applying a forward bias between the gate and the source, the area through which a main current flows increases, which can decrease the ON voltage at a forward conduction state. Further, by applying the forward bias to the gate, which is lower than the built-in voltage, since minority carriers are not injected from the gate regions into the drain region, current of only an amount corresponding to the capacity of a depletion layer flows between the gate and the source, and so the drive power for the device can be reduced to a low level. Further, since minority carriers are not accumulated in a SIT, the turning-off time and the turning-off loss do not increase. Consequently, the high-speed switching performance, which is one of excellent features of a unipolar element, can be maintained.

DETAILED DESCRIPTION OF THE EMBODIMENTS

Figure 1:
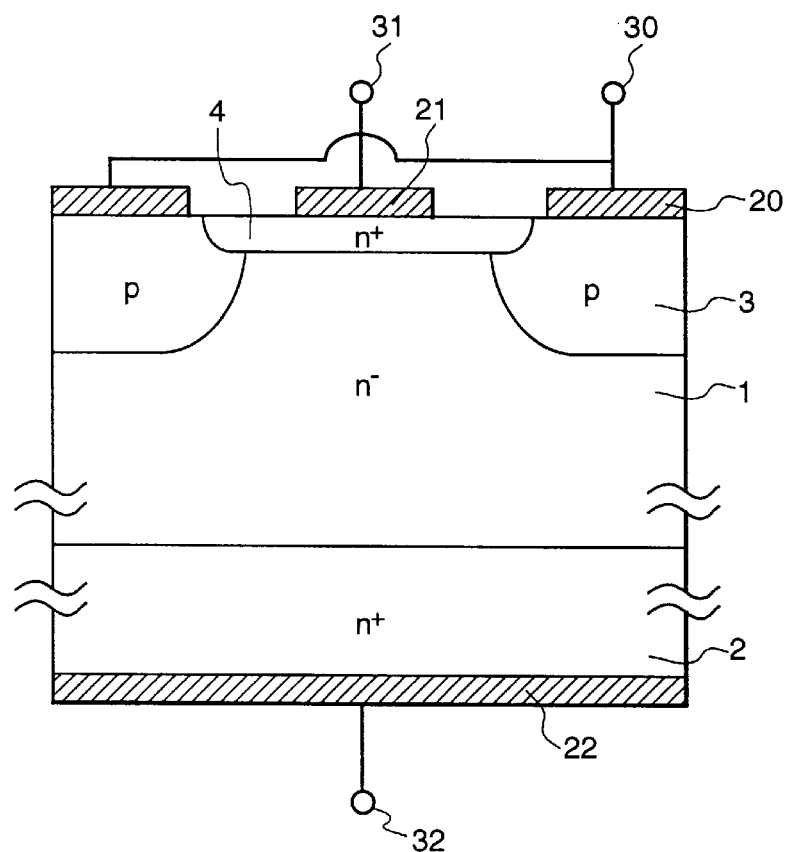
FIG. 1 is a vertical cross-sectional view of a silicon carbide static induction transistor representing an embodiment according to the present invention.

Hereinafter, details of the present invention will be explained with reference to the drawings.

Further, each of the embodiments in the drawings showing the structure of a semiconductor device will be explained for only one channel in a device. Provided that a semiconductor device according to the present invention deals with a large current, a plurality of channels having structure as explained with reference to each embodiment according to the present invention are formed in parallel into a multi-channel type semiconductor device.

FIG. 1 is a vertical cross-sectional view showing the structure of a planar gate type static induction transistor representing an embodiment according to the present invention.

In a semiconductor substrate made of silicon carbide, a n-type drain region 2 of a comparatively high impurity concentration extends into the substrate from the bottom surface (the lower side of FIG. 1) of the substrate, and a n-type drift region 1 including an impurity concentration lower than that of the drain region 2 contacts the drain region 2. Further, a n-type source region 4 including an impurity concentration higher than that of the drift region 1 extends from the top surface (the upper side of FIG. 1) of the substrate into the drift region 1 of the semiconductor substrate. Further, at both outer sides of the n-type source region 4, p-type gate regions 3 of an impurity concentration higher than that of the n-type drift region 1 extend from the other surface of the semiconductor substrate into the n-type drift region 1 so as to contact and be overlapped by both side parts of the source region 4. Moreover, the p-type gate regions 3 extend deeper into the semiconductor substrate than the source region 4. That is, the depth of the p-n junction between the n-type drift region 1 and each p-type gate region 3 is deeper than that between the n-type source region 4 and each p-type gate region 3. At the bottom surface of the semiconductor substrate, a drain electrode 22 is provided in contact with to the n-type drain region 2, and is electrically connected to the n-type drift region 1. At the top surface of the semiconductor substrate, a source electrode 21 is provided in contact with to the n-type source region 4, and respective gate electrodes 20 are provided in contact with to the p-type gate regions 3 at the respective outer sides of the n-type source region 4. The drain electrode 22, the source electrode 21, and the gate electrodes are connected to a drain terminal 32, a source terminal 31, and a gate terminal 30, respectively. Further, the static induction transistor of this embodiment is connected to external circuits via those terminals.

In this embodiment, although each p-type gate region 3 of a high impurity concentration contacts the n-type source region 4, since the semiconductor substrate is made of silicon carbide, the withstand voltage of the p-n junction between the n-type source region 4 and each p-type gate region 3, that is, the gate withstand voltage, can be increased. As mentioned above, since a high gate withstand voltage is obtained without providing a region of an impurity concentration lower than that of the p-type gate regions 3 and the n-type source region 4 formed between those gate regions 3 despite the fact that the p-type gate regions 3 and the n-type source region 4. are in contact, high accuracy is not required for a mask-alignment to align a pattern of the p-type regions 3 and a pattern of the n-type source region 4 in the production processing. In some of the patterns, it is possible to omit mask-alignment. Therefore, since the scattering of the gate withstand voltage can be suppressed in the production processing, the yield of the semiconductor devices can be improved. Furthermore, since the area of the source region 4 can be increased, a large current can flow in a semiconductor device.

Figure 3A:
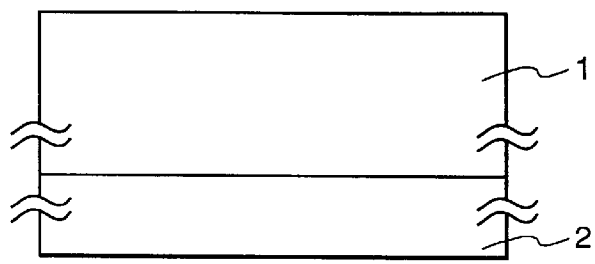
FIG. 3A–FIG. 3D show steps of production processing of the silicon carbide static induction transistor shown in FIG. 1.
Figure 3B:
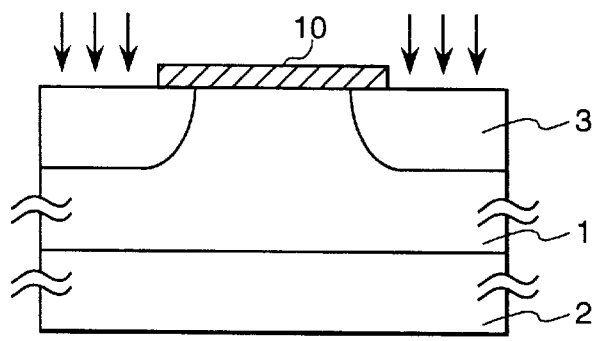
Figure 3C:
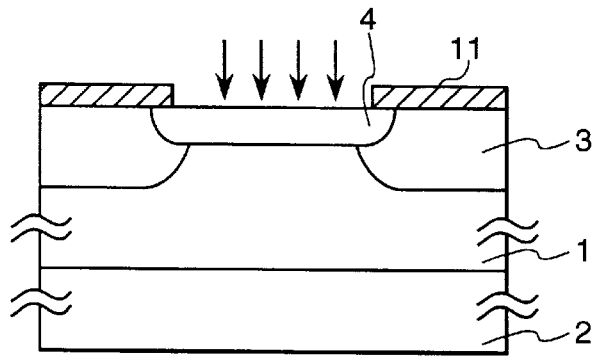
Figure 3D:
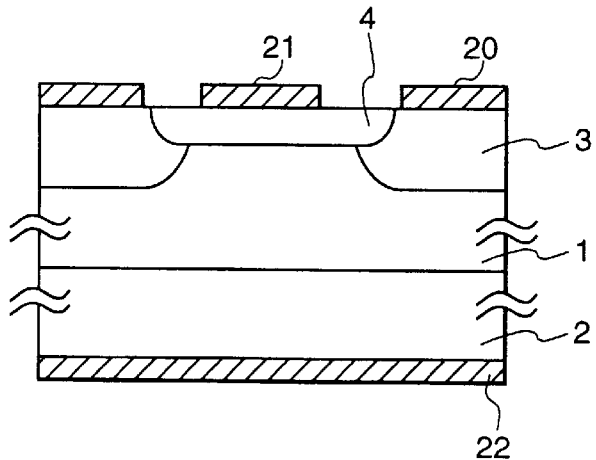

FIGS. 3A–3D are vertical cross-sectional views of the semiconductor device shown in FIG. 1 for explaining a method of producing the semiconductor device. FIG. 3A shows a process in which the n-type drain region 1 of a low impurity concentration is formed on the n-type drain region 2 of a high impurity concentration region by the epitaxial growth method. Further, as shown in FIG. 3B, the p-type gate regions 3 are formed at the top surface of the n-type drift region 1 of a low impurity concentration by injecting ions of p-type impurity, such as aluminum, with a gate region forming mask 10 for shielding the injected ions. Moreover, as shown in FIG. 3C, the n-type source region 4 of a high impurity concentration is formed by injecting ions of n-type impurity, such as nitrogen, with a mask 11. In this process, the n-type source region 4 is formed so as to overlap the p-type gate regions at both side parts of the source region 4. Furthermore, the gate electrodes 20, the source electrode 20, and the drain electrode 22 are formed as shown in FIG. 3D.

Since the diffusion coefficient of impurity in silicon carbide is low by approximately ¹/₁₀₀₀₀ of silicon, the thermal diffusion method can not be practically applicable. Therefore, the ion injection method is preferable for forming the p-type gate regions 3 in the silicon carbide static induction transistor according to the present invention. In the following, forming the p-type gate regions 3 of a high impurity concentration in the silicon carbide static induction transistor by using the ion injection method will be discussed.

Conventionally, the thermal diffusion method has been used to form a p-type gate region of a high impurity concentration in a static induction transistor made of silicon semiconductor since it is necessary to form a deep p-type gate region. Usually, a depth of 60 $\mu$m in a p-type gate region of high impurity concentration is required for a static induction transistor having a 5 kV withstand voltage. By using the ion injection method, even if ions of high energy such as 10 MeV are injected, the depth of an ion injected region is about 10 $\mu$m, and so it is difficult to inject ions to a depth of 60 $\mu$m.

On the other hand, a depth of approximately 5 $\mu$m in the p-type gate regions 3 of a high impurity concentration is required for the silicon carbide static induction transistor. This depth of an ion injected region can be realized by injection ions of approximate 5 MeV. Thus, for the silicon carbide static induction transistor, the ion injection method is applicable to form the p-type gate regions 3.

It is desirable when the impurity concentration of the p-type gate regions 3 of a high impurity concentration is lower than that of the n-type source region 4 of a high impurity concentration so that a depletion layer generated between the p-type gate regions 3 of a high impurity concentration and the n-type source region 4 of a high impurity concentration extends in the direction to the p-type gate regions 3 of a high impurity concentration. The reasons for this are explained as follows; that is, in (1) to (3).

(1) In silicon carbide, the impurity energy level, especially, the acceptor level, is deeper than that in silicon. Provided that boron is used as acceptors, the acceptor level is approximately 300 meV in silicon carbide, while it is 45 meV in silicon. Therefore, as to acceptors existing at lattice positions, the percentage of acceptors activated at room temperature is several percent. Consequently, in order to make the impurity concentration of the p-type gate regions 3 high so that a depletion layer does not extend, it is necessary to inject a large amount of ions, which possibly causes deficiencies in the semiconductor substrate.

(2) For obtaining a high voltage amplification factor, it is necessary to form a deeper p-n junction in the p-type gate regions 3 of a high impurity concentration in comparison with the n-type source region 4 of a high impurity concentration. Therefore, it is required to inject ions of high energy, in forming the p-type gate regions 3 of a high impurity concentration. However, it causes deficiencies to inject a large amount of ions deeply.

(3) If the impurity concentration of the n-type source region 4 is comparatively high, electrons are injected from the source when current flows at an ON state. By the injected electrons, a conductivity modulation is caused, which reduces the resistance in the substrate.

Figure 4:
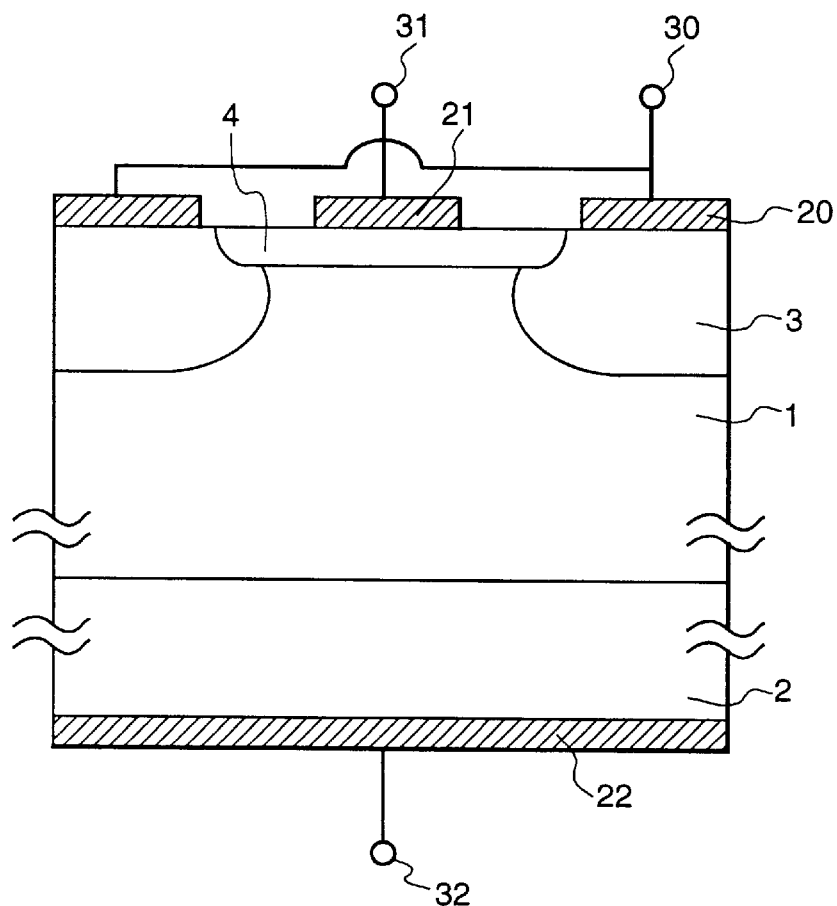
FIG. 4 is a vertical cross-sectional view of a silicon carbide static induction transistor representing another embodiment in which the blocking characteristics are further improved, according to the present invention.

FIG. 4 is a vertical cross-sectional view of the structure of an example of a static induction transistor in which the p-type gate regions 3 and the n-type source region 4 are formed by the ion injection method by making use of the low diffusion coefficient of impurity in silicon carbide. Similarly to the embodiment shown in FIG. 1, the p-type gate regions 3 of a high impurity concentration are formed so as to overlap the n-type source region 4 of a high impurity concentration at both side parts of the source region 4. The position at which the distance between a plurality of p-type gate regions 3 (two regions in this embodiment of a high impurity concentration arranged at the outer sides of the n-type source region 4 of a high impurity concentration is minimum is deeper than the level of the bottom face of the n-type source region 4 of a high impurity concentration. In this embodiment, this position is located approximately at a half of the depth in the p-type gate regions 3. In the following, it will be explained how the shape of the p-type gate regions 3, which is shown in FIG. 4, can be formed.

Figure 5:
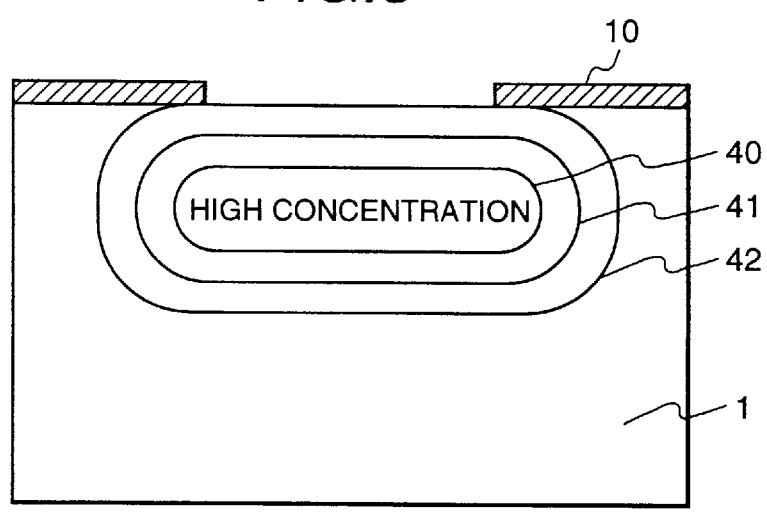
FIG. 5 is a diagram which shows contours of the distribution of ion concentration right after injecting ions into a semiconductor substrate by using masks.

FIG. 5 shows contours of a distribution of the ion concentration after ions are injected, which is viewed from the direction of the other side of the silicon carbide substrate, parallel to the figure. The ion concentration decreases in the order of the contours 40, 41, and 42. The reason why ions enter the back side of the mask 10 is that the injected ions are scattered in the horizontal direction by nuclide collisions of the injected ions and atoms of material composing the substrate. Also in a silicon substrate, right after ion injection, a distribution of the injected ion concentration has a horizontally extending, central high concentration region which is shown in FIG. 5. However, since the injected ions are re-distributed by annealing effects due to deficiency recoveries and activation of the injected ions, the above-mentioned distribution formed right after ion injection is not retained. On the other hand, in silicon carbide, since the diffusion coefficient of impurity is much lower by ¹/₁₀₀₀₀ than that of silicon, the re-distribution of injected ions does not occur, and the distribution of injected ions formed right after ion injection can be kept.

According to the above-mentioned structure of a semiconductor device, at the OFF operation, respective depletion layers extending from the two p-n junctions between the n-type drift region 1 of a low impurity concentration and the respective p-type gate regions 3 of a high impurity concentration into the n-type drift region 1 of a low impurity concentration contact each other at a location spaced from the n-type source region 4 of a high impurity concentration. Thus, the voltage amplification factor $\mu$ can be increased. Further, by forming the p-type gate regions 3 with the ion injection method, as shown in FIG. 5, the position at which the width of the channel is minimum conforms to that at which the impurity concentration is maximum. Consequently, the depletion layers extend most into the n-type drift region 1 of a low impurity concentration at the position of the minimum interval of the channel. Thus, it is possible to block the voltage between the source and the gate by applying a small gate bias voltage.

In order to obtain a large voltage amplification factor $\mu$, the depth of several $\mu$ m is required for the p-type gate regions 3 of a high impurity concentration shown in FIG. 4. Therefore, it is necessary to inject ions of high energy. To shield ions of high energy, a thick mask is required. Further, for realizing the distribution of impurity shown in FIG. 5, it should be avoided that injected ions are scattered at the side wall of the mask. This requires that the mask 10 be as thin as possible. Eventually, as material composing the mask 10, organic material, resist, metal, silicide, $SiO_2$, and so forth, are considered to be effective.

By using the multi-layer resist method, it is possible to process the side face of a mask so as to be perpendicular to the surface of the semiconductor substrate and to prevent ions from scattering at the side face of the mask. FIGS.

Figure 6A:
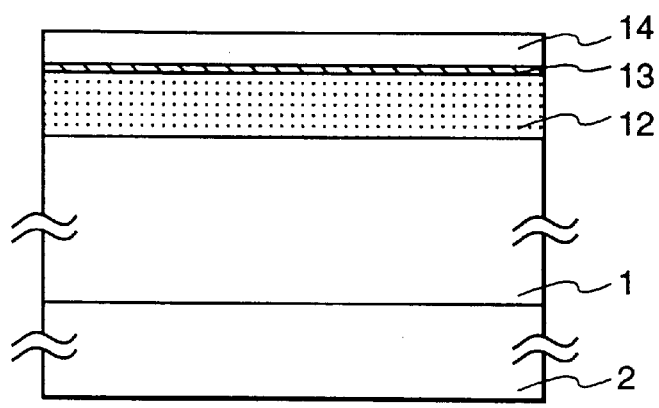
FIG. 6A–FIG. 6C show steps of production processing of a multi-layer resist.
Figure 6B:
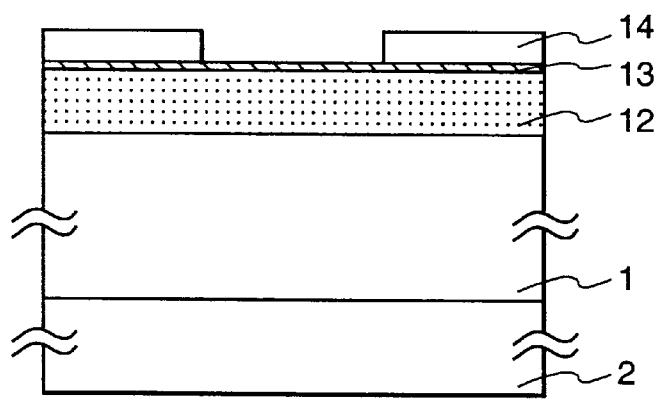
Figure 6C:
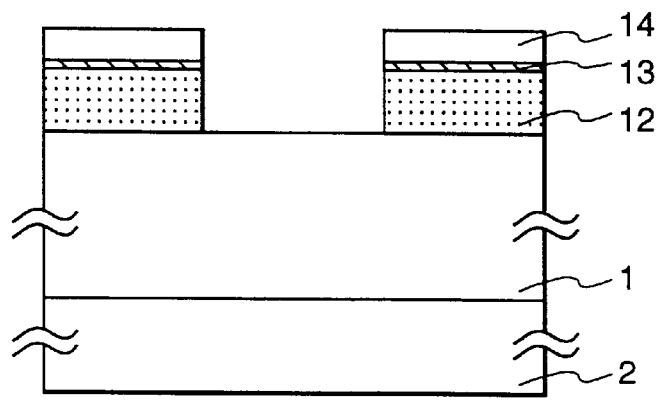

6A–6C are diagrams for explaining a method of processing a multi-layer resist. At first, as shown in FIG. 6A, a laminated structure composed of an organic layer 12, an inorganic intermediate layer 13, and a resist layer 14, are formed on the surface of the semiconductor substrate. The inorganic intermediate layer 13 is used to prevent the organic layer 12 and the resist layer 14 from mixing. Further, as shown in FIG. 6B, the resist layer 14 is processed by exposure to light. Furthermore, as shown in FIG. 6C, the inorganic intermediate layer 13 is processed by etching with a mask of the processed resist layer. Moreover, patterning of the organic layer 12 is performed by the dry etching method of $O_2$-RIE (Reactive Ion Etching) with a mask composed of the processed resist layer 14 and inorganic intermediate layer 13. As material used for the organic layer 12, polyimide resin is applicable. After the process shown in FIG. 6C, ion injection is performed by using the multi-layer mask obtained by the above-mentioned process.

Since silicide has a large ion shielding effect, and the mask can be made thin, scattering of injected ions at the side wall of the mask can be suppressed. On the other hand, the channeling phenomena in which injected ions pass through a mask occur in a metal layer. Therefore, when metal is used for the mask, it is necessary to form a noncrystalline film between a metal layer and the surface of the semiconductor substrate to prevent the channeling phenomena.

Figure 7:
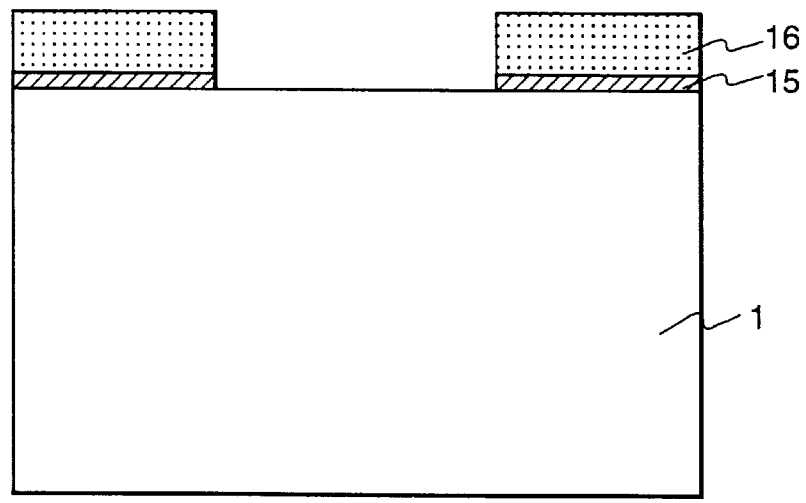
FIG. 7 is a vertical cross-section of a mask composition used for fabricating the silicon carbide static induction transistor shown in FIG. 4.

In silicon carbide, it is possible to reduce deficiencies generated in the ion injection by the injecting ions by heating the silicon carbide substrate to keep it at a high temperature. By using a mask of a high heat resistance, ion injection under a high temperature condition is possible. FIG. 7 shows an embodiment in which a semiconductor device is produced by using a mask having a high heat resistance, which has a large ion shielding effect even if its thickness is thin and which can be easily removed after the ion injection. The mask has a laminated structure composed of a nitrogen carbide layer and a high melting point metal silicide layer formed on the nitrogen carbide layer. High melting point metal silicide has both a high heat resistance and a large ion shielding effect. Since a part in the mask, which contacts the surface of the semiconductor substrate, is formed by nitrogen carbide, the mask can be easily removed after ion injection. As a high melting point metal, tungsten silicide, molybdenum silicide, etc., are applicable.

Figure 8:
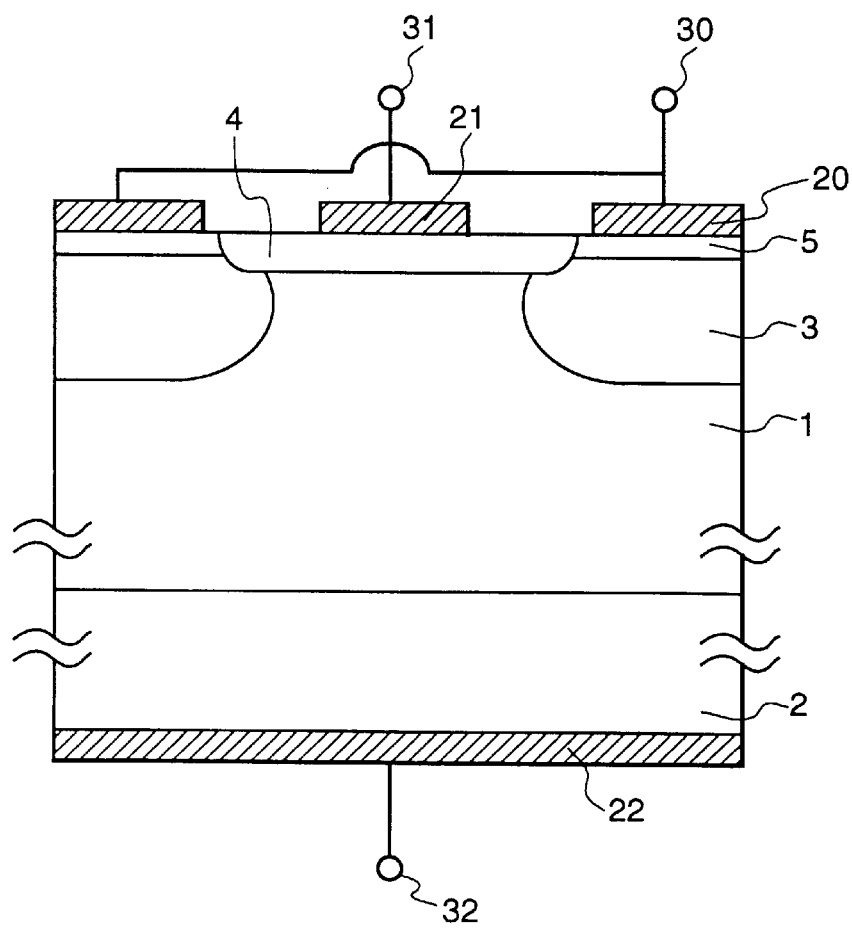
FIG. 8 is a vertical cross-sectional view of a silicon carbide static induction transistor representing another embodiment in which the contact resistance of the gate electrode is lower than that in the transistor shown in FIG. 4.

FIG. 8 shows a static induction transistor representing another embodiment in which the contact resistance between the gate electrodes 20 and the p-type gate regions 3 of a high impurity concentration is lower than that in the embodiment shown in FIG. 4. A p-type region 5 of a higher impurity concentration is formed between each p-type gate region 3 of a high impurity concentration and each gate electrode 20. As explained with reference to FIG. 5, the impurity concentration at the surface of each gate region 3 does not become high by ion injection of one time. Therefore, ions of p-type impurities, the energy of which is lower than that of ions used in the previous ion injection, are successively injected to the surface of the gate region formed by the previous ion injection. It is possible to use either the same impurity material or different kinds of impurity material. Further, the thin thickness of the p-type region 5 is sufficient because the purpose of the second ion injection is to reduce the contact resistance at the gate electrodes 20.

Figure 9:
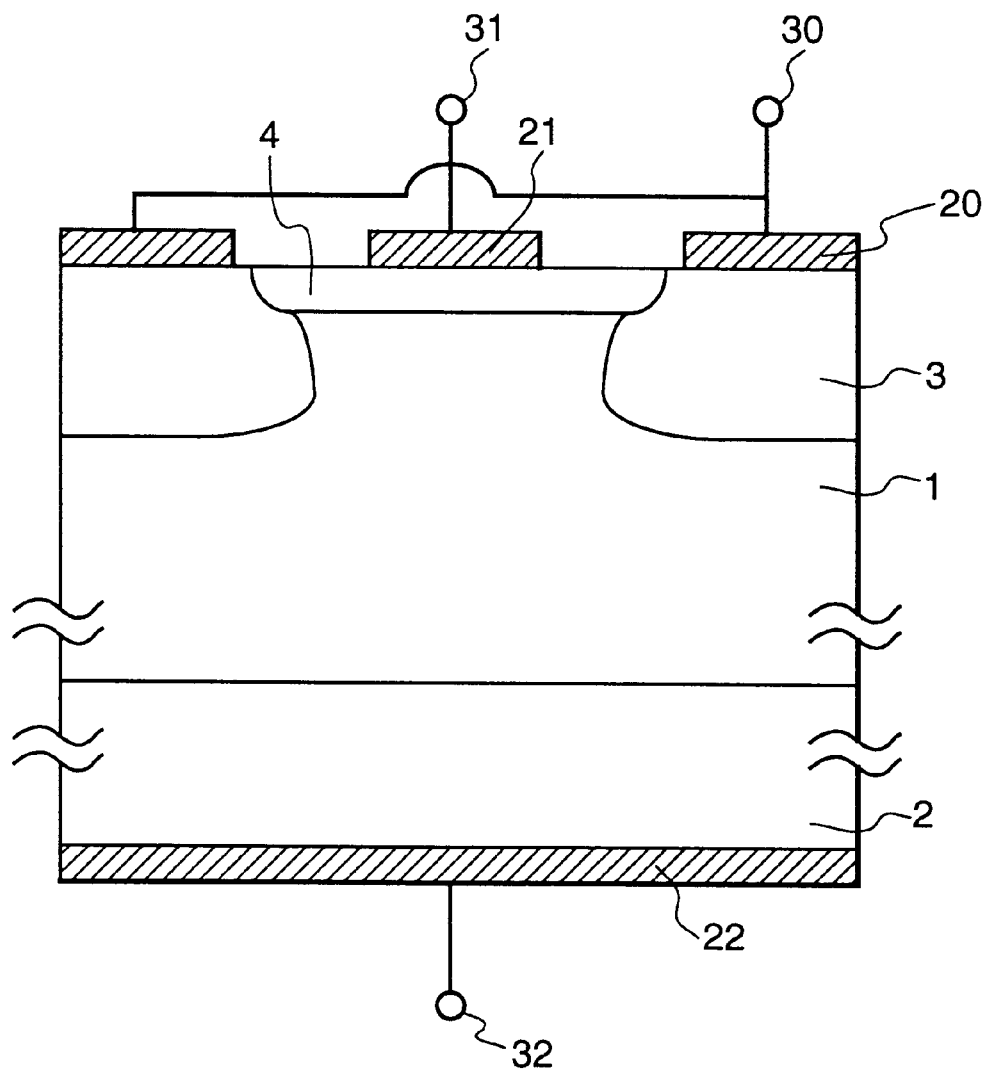
FIG. 9 is a vertical cross-sectional view of a silicon carbide static induction transistor representing another embodiment in which the blocking characteristics are further improved, according to the present invention.

FIG. 9 shows a static induction transistor representing another embodiment in which the voltage amplification factor A is increased more than that in the embodiment shown in FIG. 4. In the static induction transistor shown in FIG. 9, the position at which the interval between the p-type gate regions 3 of a high impurity concentration formed at the outer sides of the n-type source region 4 is minimum is also deeper than the bottom face level of the n-type source region 4 of a high impurity concentration, similar to the embodiment shown in FIG. 4. However, a feature of this embodiment is that the position of the minimum interval is even deeper than that in the embodiment shown in FIG. 4.

Figure 10A:
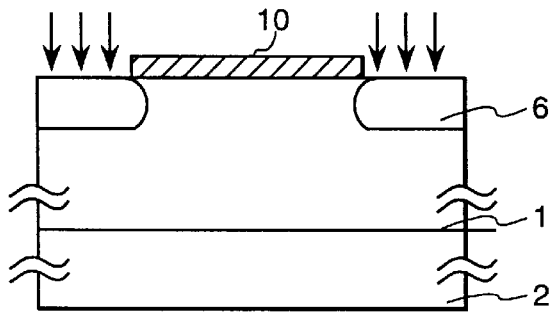
FIGS. 10A–FIG. 10E show steps of production processing of the silicon carbide static induction transistor shown in FIG. 8.
Figure 10B:
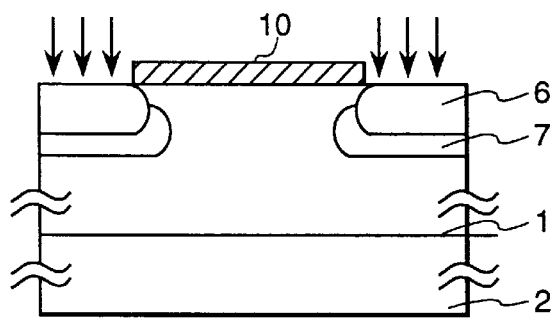
Figure 10C:
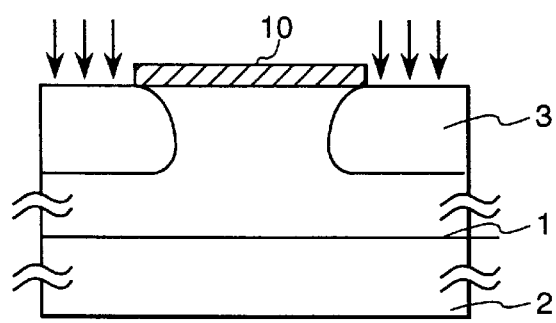

FIGS. 10A–10E show steps of the production processing of the static induction transistor shown in FIG. 9. The n-type drift region 1 of a low impurity concentration is formed on the n-type drain region 2 of the substrate of a low impurity concentration n-type semiconductor by the epitaxial growth method. Successively, as shown in FIG. 10A, a region 6 is formed by injecting ions of p-type impurities such as aluminum to the surface of the n-type drift region 1 of a low impurity concentration in the first ion injection. If the side wall of the mask 10 used in the ion injection is almost perpendicular to the surface of the substrate, in the shape of the region 6 formed by the first ion injection, the minimum channel width is narrower than the width of the mask 10 as shown in FIG. 5, which is caused by scattering of the injected ions in the horizontal direction. Further, as shown in FIG. 10B, a region 7 is formed in the second ion injection by injecting ions of an energy higher than that of ions injected in the first ion injection. The horizontal travel length of scattered ions is determined by the quantities of energy loss of ions at nuclide collisions between injected ions and nuclides in the substrate. As the energy of the injected ions increases, since the energy loss at nuclide collisions increases monotonously, the horizontal travel length of scattered ions also increases. According to the above-mentioned processing, the shape of the gate regions 3 shown in FIG. 10C can be realized by the multi-time ion injections using the same or different kinds of impurities, the energy of which is changed at each ion injection time.

Figure 10D:
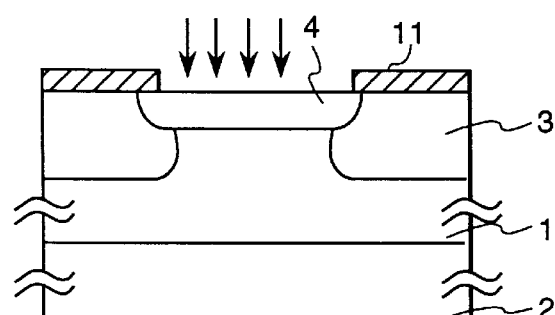
Figure 10E:
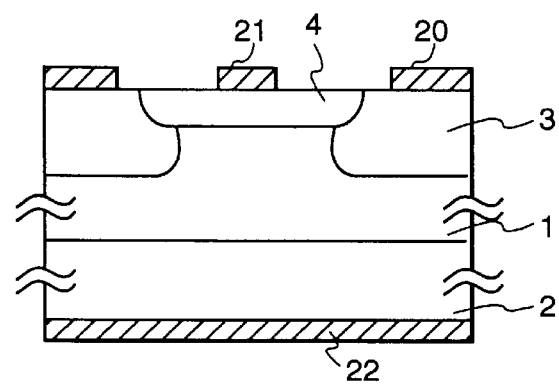

The heavier the mass of an atom is, the larger the energy loss at a nuclide collision is. Therefore, as the mass of impurity atoms increases, each gate region 3 swells at the lower position. Furthermore, as shown in FIG. 10D, the n-type region 4 is formed by injecting ions of n-type impurities such as nitrogen. Finally, the electrodes 20–22 are formed as shown in FIG. 10E.

Figure 11:
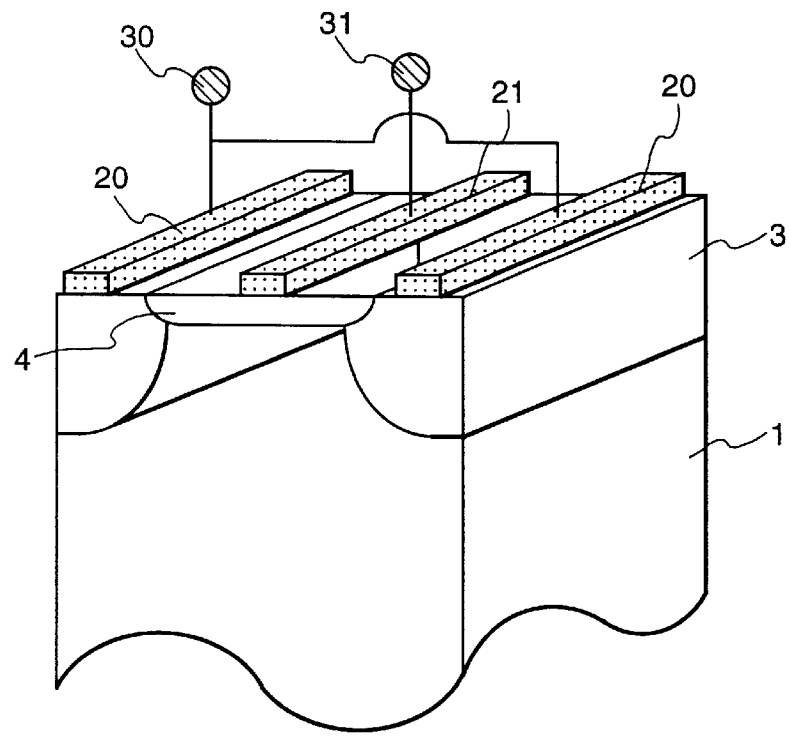
FIG. 11 is a perspective illustration of the silicon carbide static induction transistor after forming of its electrodes is completed, representing an embodiment according to the present invention.

FIG. 11 is a perspective view of the silicon carbide static induction transistor shown in FIG. 1. As mentioned IT: above, in silicon carbide, the impurity energy level, especially the acceptor level, is deep. If boron is used for acceptors, since the percentage of acceptors activated in impurities having a concentration which is of the order of $10^{18}$ cm$^{-3}$ is several %, the actual concentration of carrier is approximately $10^{16}$ cm$^{-3}$. In this case, since the resistivity of the p-type gate regions 3 is hundreds m Ω·cm, the decrease of the voltage along each gate region 3 is not negligible. Therefore, in a silicon carbide static induction transistor, it is necessary to form a gate electrode 20 along each gate region 3. In FIG. 11, numerals 20, 21, 30, and 31, indicate the gate electrodes, the source electrode, the gate terminal, and the source terminal, respectively. If the planar gate structure shown in FIG. 11 is adopted, the respective gate electrodes 20 can be arranged along the respective p-type gate regions 3. Thus, the planar gate structure is suitable for a silicon carbide static induction transistor.

Figure 12:
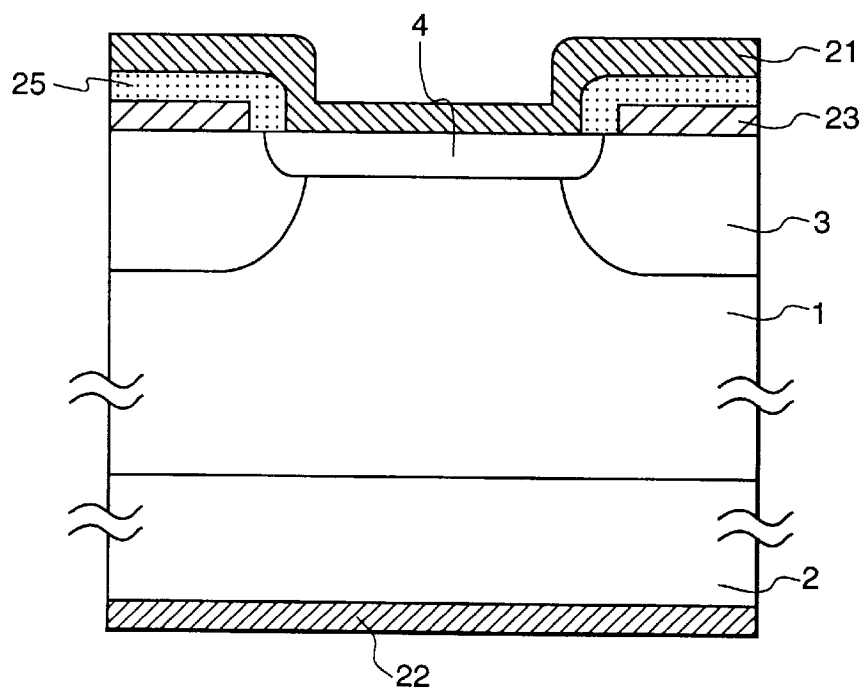
FIG. 12 is a vertical cross-sectional view of the silicon carbide static induction transistor after forming of its electrodes is completed, representing an embodiment according to the present invention.

FIG. 12 shows a silicon carbide static induction transistor of another embodiment in which polysilicon is used for gate electrodes 23. In the silicon carbide static induction transistor, current flowing in the n-type drift region 1 of a low impurity concentration between the n-type source region 4 and the n-type drain region 2, of which the impurity is low, is turned-on or turned-off in accordance with the size of the depletion layers, which is controlled by the voltage applied to the p-type gate regions 3 of a high impurity concentration. Since the amount of current flowing in the gate electrodes 20 is only an amount corresponding to the capacitance of the formed depletion layers, polysilicon works as the gate electrodes 20, despite its larger resistivity in comparison with metal, such as aluminum. In this embodiment, by using polysilicon for the gate electrodes 23, the high temperature performance of the gate electrodes 23 is more stable than that of electrodes made of metal such as aluminum. Further, since the insulation using oxide films becomes easy, multi-layer wiring is possible, and a source electrode can be formed on the whole top surface of the transistor by using the evaporation method. In this embodiment, layers of the source electrode 24 and the polysilicon gate electrodes 23 are insulated from each other by oxide films 25. Since mask alignment is not necessary in evaporation processing of the source electrode 24, the yield of static induction transistors can be improved. As for the gate electrodes 23, silicide and salicide are applicable, in addition to polysilicon.

Furthermore, application of the present invention is not restricted to the above embodiments, for example, the present invention is applicable to a semiconductor device in which a conductivity P-type or n-type of each region is different from that of a corresponding region in a semiconductor of the above embodiments. Thus, the present invention can be applied to a static induction thyristor. A static induction thyristor can be realized, for example, only by changing the n-type drain region 2 to a region of p-type conductivity.

As mentioned above, in accordance with the present invention, since the high accuracy in alignment of a source region and gate regions is not required, the production of static induction transistors having a high withstand voltage becomes easier. Further, since the area of the source region can be increased, it is possible for a large current to flow in the static induction transistor. Moreover, by composing a transistor such that the position of the minimum channel width is located inside the substrate, it is possible to block a large voltage between the source and the drain by a small gate voltage, which improves the voltage amplification factor.

Figure 2:
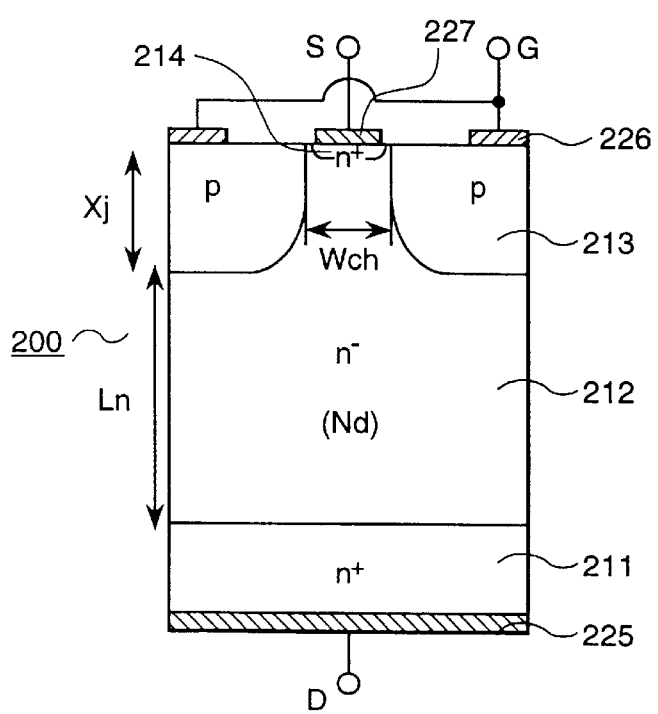
FIG. 2 is a vertical cross-sectional view of a conventional static induction transistor.
Figure 13A:
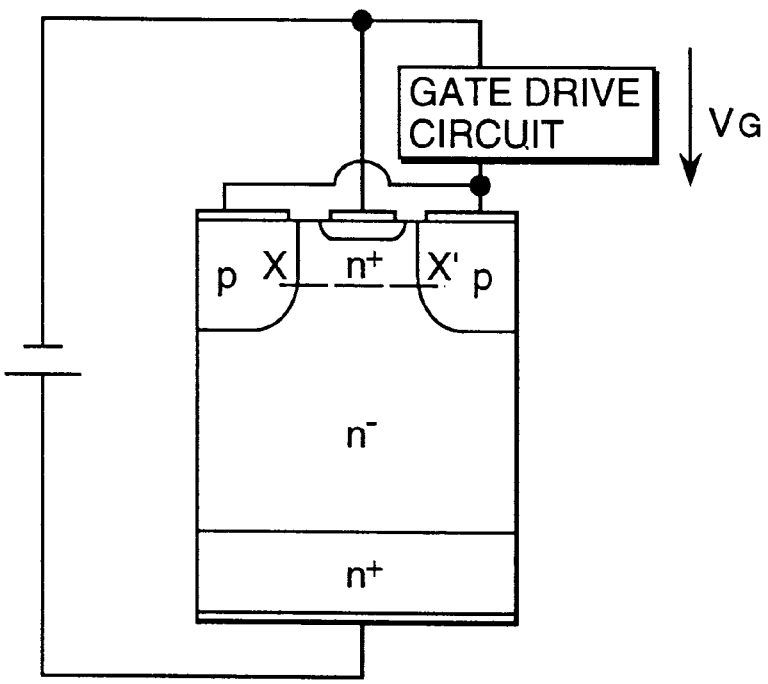
FIG. 13A and FIG. 13B are diagrams for explaining a gate drive method of a SIT, representing an embodiment according to the present invention.
Figure 13B:
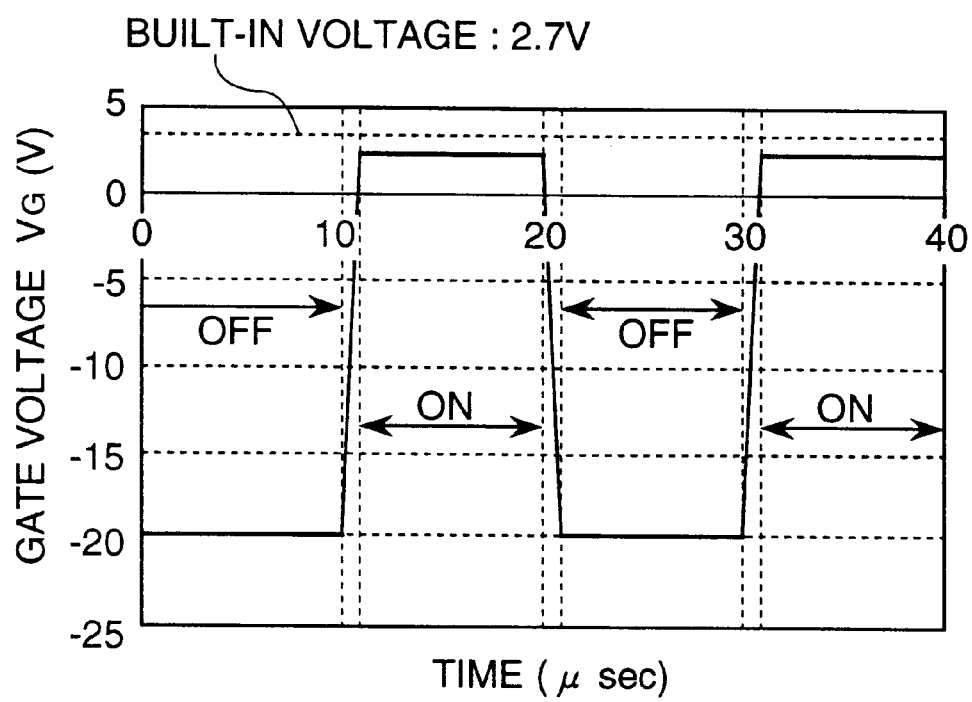

FIG. 13A and FIG. 13B are diagrams for explaining a method of driving a gate of a SiC-SIT (silicon carbide static induction transistor) according to the present invention. Although the junction structure of the SIT is the same as that of the conventional one shown in FIG. 2, monocrystal SiC is used as the semiconductor material. The SIT of this embodiment has a withstand voltage of the 900 V class when a large reverse gate voltage of more than 10 V is applied. Further, in this SIT, the built-in voltage between a gate electrode and a source electrode, that is, the built-in voltage at the p-n junction between each gate region and a drift region, is approximately 2.7 V.

As shown in FIG. 13A, a drain electrode is connected to one terminal of a main power source, and the source electrode is connected to the other terminal of the main power source. The gate electrodes and the source electrode are connected to a gate drive circuit, and a gate voltage $V_G$ is applied between those electrodes. A forward bias is applied between the gate electrodes and the source electrode if $V_G$ is positive, otherwise, a reverse bias is applied between those electrodes if $V_G$ is negative.

In this embodiment, for the period of 0–10 μs, the SIT is turned off by applying −20 V as $V_G$. At this state, the SIT can block a main power source voltage by 900 V equal to the withstand voltage of the SIT. Successively, for the period of 10–11 μs, $V_G$ is changed from −20 V to 2.5 V. Since the bias between the gate electrodes and the source electrode is changed from a reverse bias to a forward bias, the SIT is turned on. Further, for the period of 11–20 μs, $V_G$ is set to a value of more than 0 V and less than the built-in voltage. Since the built-in voltage is 2.7 V in this embodiment, $V_G$ is set to 2.5 V. During this period, the SIT is kept in an ON state. Moreover, since a forward bias is applied between the gate electrodes and the source electrode, the ON voltage is reduced for a reason to be mentioned later. Successively, for the period of 20–21 μs, $V_G$ is changed from 2.5 V to −20 V. Since the bias between the gate electrodes and the source electrode is changed from a forward bias to a reverse bias, the SIT is again turned off. At this change, since $V_G$ is less than the built-in voltage in the ON state before this turning-off change, few minority carriers are injected from the gate regions into the drift region in the SIT. Therefore, the turning-off time and the turning-off loss can be reduced. After the time of 21 μs, the above-mentioned changes of $V_G$ are repeated.

Figure 14:
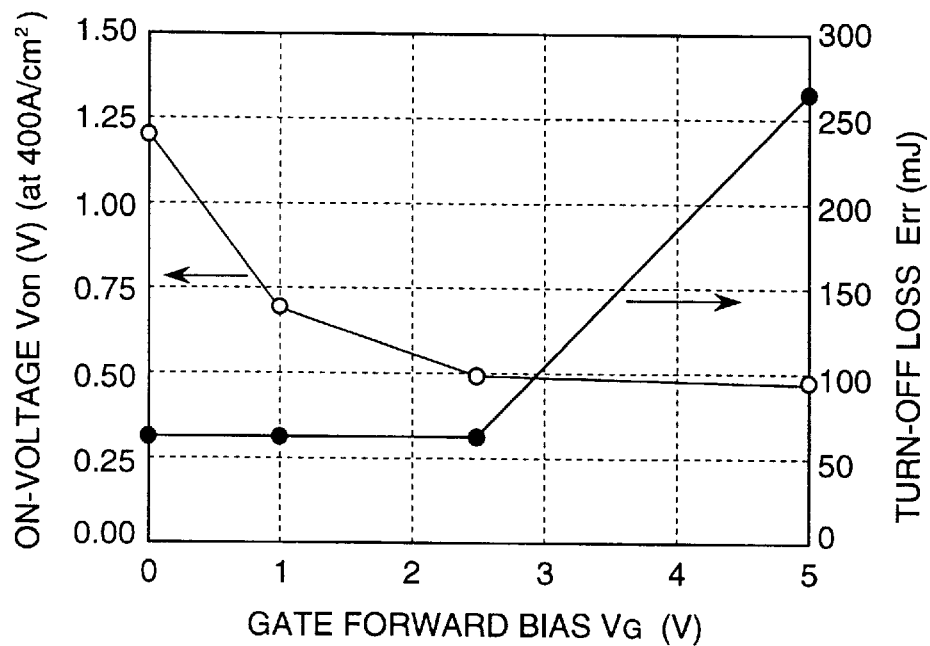
FIG. 14 is a graph which shows respective relations between the forward gate bias and the ON voltage, and between a forward gate bias and the turn-off loss.

FIG. 14 shows respective relations between the gate voltage $V_G$ in the forward bias state and the ON voltage $V_{ON}$, and between the gate voltage $V_G$ in the forward bias state and the turning-off loss $E_{rr}$ under the condition of a current density JF of 400 A/cm². When $V_G$ is within a range of 0 V to 2.7 V, the ON voltage rapidly decreases from 1.2 V to 0.5 V as $V_G$ increases. Further, when $V_G$ is within a range of 0 V to 2.7 V, the ON voltage varies scarcely, and it is seen that the decrease of the ON voltage is saturated. On the other hand, the turning-off loss Err rapidly increases from about a value of 2.7 V in $V_G$.

In the following, it will be explained why the ON voltage decreases as $V_G$ increases. In the embodiment shown in FIG. 13A and FIG. 13B, since the built-in voltage is about 2.7 V, few minority carriers are injected from the gate regions into the drift region when $V_G$ is within a range of 0 V to 2.7 V. That is, the conductivity modulation hardly causes a decrease in the ON voltage. From examination by the inventors, it was found that the ON voltage decrease is caused by widening of a current flowing area in the SIT, which is due to decreasing of the potential barrier at the channel part indicated by (X–X') in FIG. 13A, because of narrowing of depletion layers extending from the gate regions, caused by the applied $V_G$. Further, results of the examination carried out by the inventors will be explained more in detail in the following.

Figure 15:
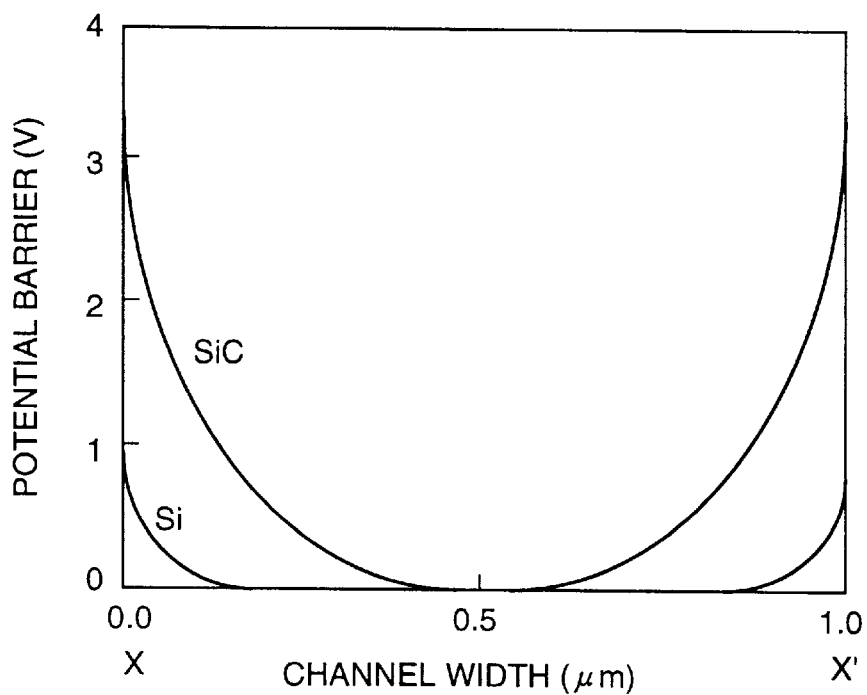
FIG. 15 is a graph which shows a potential distribution at a channel part.

FIG. 15 shows a distribution of the potential barrier for electrons along the direction (X–X') at the channel part (X–X') shown in FIG. 13. For comparison with the Si-SIT shown in FIG. 2, a potential distribution of the potential barrier in the Si-SIT is also shown in FIG. 15. Hereupon, $V_G$ is 0 V, that is, the SIT is in a non-bias state.

In FIG. 15, the built-in voltage in each of Si and SiC is assumed as approximately 0.7 V and 2.7 V. Consequently, the potential barrier of SiC is higher by 4 times than that of Si. Further, in a non-bias state, the relation between the built-in voltage and the width of a depletion layer is expressed by equation (1).

$$W = \sqrt{\frac{2\varepsilon V_{bi}}{qN_d}}, \tag{1}$$

where $\varepsilon$ is the permittivity; $V_{bi}$ is the built-in voltage; q is a unit electric charge; and $N_d$ is the impurity concentration of the drift region. Since the built-in voltage of SiC is higher by 4 times than that of Si, the width of a depletion layer formed in SiC is twice as wide as that in Si, provided that $\epsilon$ and $N_d$ have the same respective values in SiC and Si. Applying a forward bias between the gate and the source contributes to a widening of the a current flowing area by narrowing the wide area of a depletion layer to lower the potential barrier.

As apparently seen in FIG. 15, since the potential barrier of Si is low in a non-bias state as mentioned above, there is only a small effect to lower the potential barrier when a forward bias is applied between the gate electrode and the source electrode. On the other hand, since the potential barrier of SiC is high even in a non-bias state, there is a large effect to widen the current flowing area by lowering the potential barrier.

Returning to FIG. 14, the reason why the turning-off loss $E_{rr}$ increases rapidly from about 2.7 V of $V_G$ is explained as follows. If $V_G$ exceeds the built-in voltage, holes of minority carriers are injected from the gate regions into the drift region. Since the injected holes become remaining carriers at a turning-off state, the turning-off loss Err increases.

As mentioned above, in the embodiment shown in FIG. 13A and FIG. 13B, since the gate voltage $V_G$ is applied so as to bias the voltage between the gate electrodes and the source electrode reversely, and $V_G$ is set to a value of more than 0 V and less than the built-in voltage, it becomes possible to decrease the ON voltage of the SIT to a level lower than that of the ON voltage in a non-bias state, and to reduce the loss occurring at turn-off switching.

Figure 16:
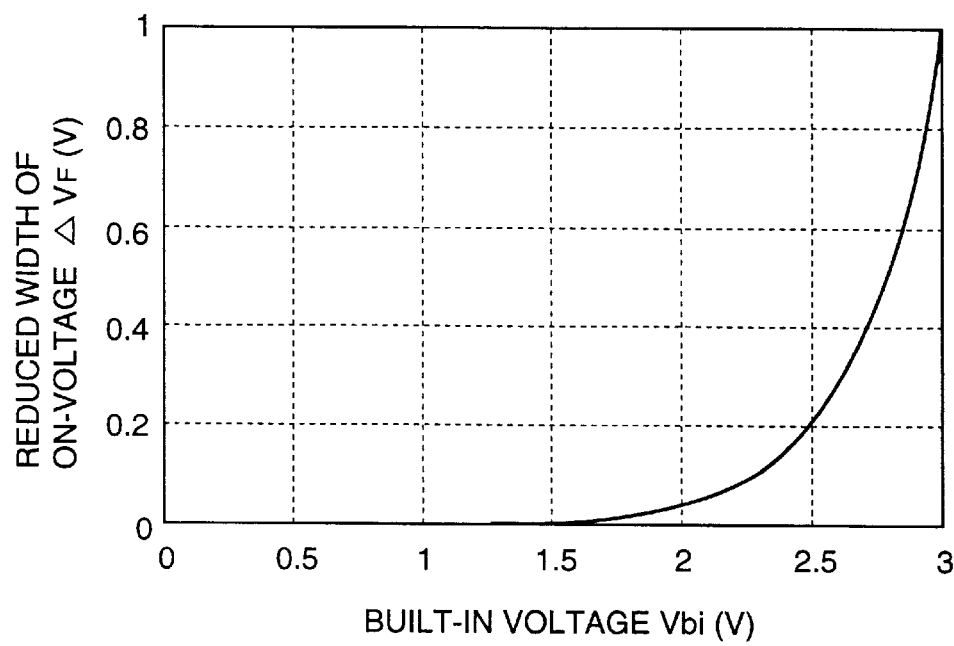
FIG. 16 is a graph which shows a relation between the built-in voltage and the reduced width of the ON voltage.

FIG. 16 shows the relation between the built-in voltage $V_{bi}$ and the reduced width $\Delta V_F$ of the ON voltage in applying the gate voltage $V_G$ so as to bias the voltage between the gate electrode and the source electrode in the forward direction. Hereupon, $\Delta V_F$ is the difference between the ON voltage in a gate forward bias state and that in a non-bias state. The value of $V_G$ is set to 90% of $V_{bi}$. The layer junction structure in the SIT of this embodiment is similar to that in the conventional SIT shown in FIG. 2, where the gate depth $X_j$ is 2 $\mu$m; the channel width $W_{CH}$ is 1.0 $\mu$m; the thickness $L_n$ of the drift region is 8 $\mu$m; and the impurity concentration $N_d$ is $1.53 \times 10^{16}/cm^3$. When $V_{bi}$ is not higher than 2.0 V, the effect due to the forward gate bias is small. On the other hand, when $V_{bi}$ exceeds 2.0 V, the reduced width $\Delta V_F$ increases rapidly.

The reason why the forward gate bias causes a large reduced width of the ON voltage in the SIT when $V_{bi}$ exceeds 2.0 V will be explained in the following with reference to FIG. 17–FIG. 19. In these figures, the layer junction structure of the SIT is the same as that of the SIT explained by using FIG. 16.

Figure 17:
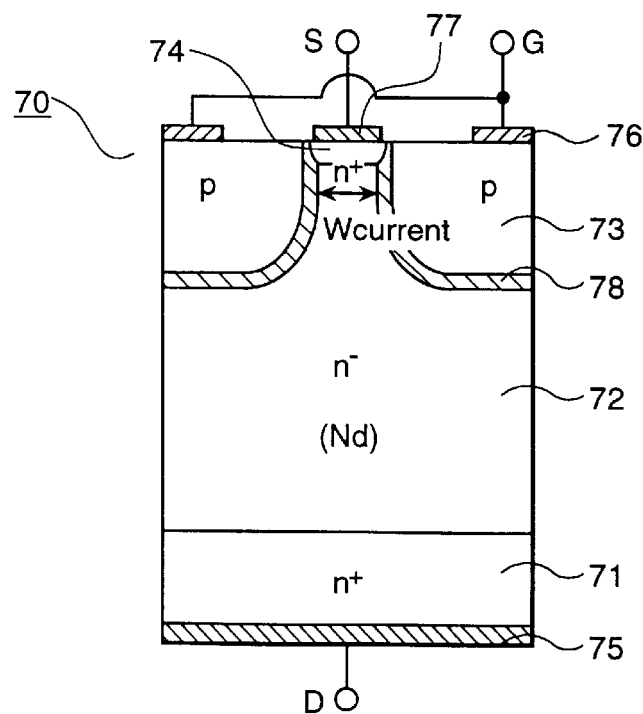
FIG. 17 is a vertical cross-sectional view of a SIT, for showing a state inside the SIT made of semiconductor material having a low built-in voltage $V_{bi}$, the bias being not applied to the gate of the SIT.

FIG. 17 shows a state of the depletion layers 78 in a non-bias state extending between the gate electrodes 76 and the source electrode 77 of a SIT made of semiconductor material such as silicon, in which the built-in voltage $V_{bi}$ is low. The depletion layer extending from a junction between the drift region 72 and each gate region 73 narrows the width $W_{current}$ of a current flowing area in the channel part on the conduction state in the SIT. However, a region in which a depletion layer is not generated still exists. Therefore, even in a non-bias state between the gate electrodes 76 and the source electrode 77, current flows comparatively well. Thus, although application of a forward bias between the gate electrodes 76 and the source electrode 77 brings about the reduction effect of the ON voltage, the effect is not remarkable.

On the other hand, in the SIT made of semiconductor material, such as SiC, of which the built-in voltage is higher than that of silicon, the region of the depletion layers generated at the channel part is larger than that generated in the silicon SIT. Therefore, $W_{current}$ becomes 0 as shown in FIG. 18. That is, the channel part is pinched off by the depletion layers. In this pinchoff state, if a bias is not applied between the gate electrodes 76 and the source electrode 77, since the potential barrier of electrons is high in the whole channel part, current hardly flows even by applying a power source voltage between the source electrode 77 and the drain electrode 75. Consequently, the ON voltage becomes very high. In this situation, if a small forward bias is applied between the gate electrodes 76 and the source electrode 77, $W_{current}$ has a value of more than 0, and becomes a similar state to that shown in FIG. 17. Consequently, the ON voltage rapidly decreases.

Figure 18:
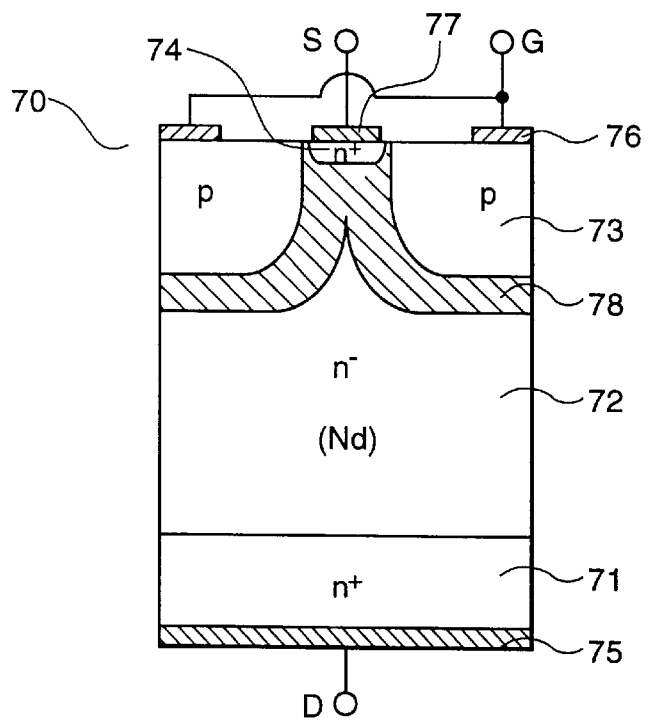
FIG. 18 is a vertical cross-sectional view of a SIT, for showing a state inside the SIT made of semiconductor material having a high built-in voltage $V_{bi}$, the bias being not applied to the gate of the SIT.
Figure 19:
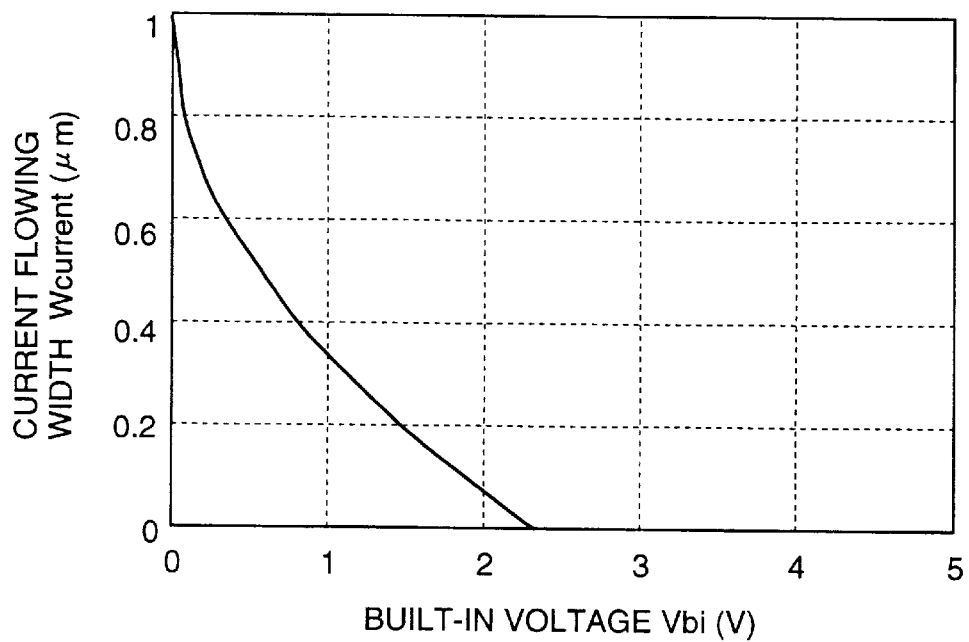
FIG. 19 is a graph which shows a relation between the built-in voltage and the current flowing width.

FIG. 19 shows the relation between the built-in voltage $V_{bi}$ and the current flowing width $W_{current}$. As $V_{bi}$ increases, $W_{current}$ decreases. If $V_{bi}$ exceeds 2 V, $W_{current}$ becomes 0. Under this condition, the state inside the SIT becomes similar to that shown in FIG. 18, that is, in such a state, a forward gate bias brings about a remarkable effect.

As apparently indicated in the above explanation with reference to FIG. 17–FIG. 19, the effects of the present invention are particularly remarkable for a SIT wherein the channel part is pinched off by depletion layers in a gate non-bias state, which is due to the high built-in voltage of the SIT. That is, the present invention is especially advantageous to a SIT made of semiconductor material of which the energy band gap is very large.

Figure 20:
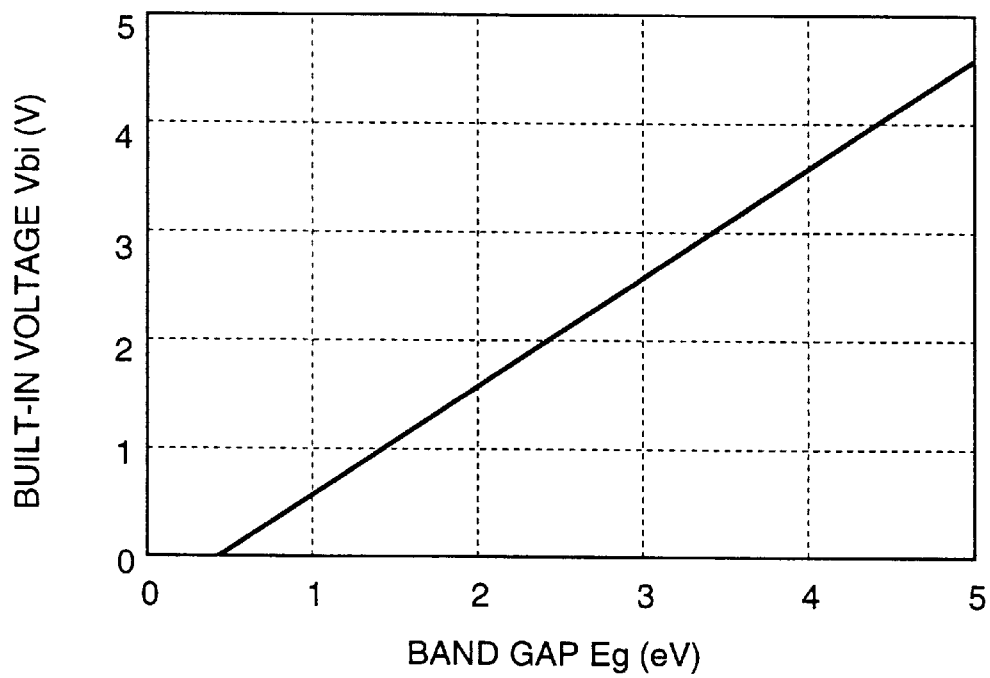
FIG. 20 is a graph which shows a relation between the band gap and the built-in voltage.

FIG. 20 shows the relation between the band gap $E_g$ and the built-in voltage $V_{bi}$. Relations expressed by equation (2) and equation (3) concerning the band gap $E_g$ and the built-in voltage $V_{bi}$ are well-known.

$$n_i = \sqrt{N_C N_V} \exp\left[-\frac{E_g}{2kT}\right], \quad (2)$$

where $n_i$ is the intrinsic carrier concentration; $N_c$ is the state density of the conduction band; $N_v$ is the state density of the valence band, $E_g$ is the band gap; k is Boltzman constant; and T is the absolute temperature.

$$V_{bi} = \frac{kT}{q} \ln \frac{N_A N_D}{n_i}, \quad (3)$$

where q is an electrical charge of an electron; $N_A$ is the acceptor concentration; and $N_D$ is the donor concentration. The relation shown in FIG. 20 is obtained by using the equations (2) and (3), which shows that semiconductor material having a band gap $E_g$ which is larger has the larger built-in voltage $V_{bi}$. The effects of the present invention are remarkable for semiconductor material having a built-in voltage of more than 2 V. Consequently, according to the relation shown in FIG. 20, the present invention is especially effective to a SIT made of semiconductor material whose band gap Eg is larger than 2.4 V. For example, silicon carbide SiC (Eg: 3.0 eV), gallium nitride GaN ($E_g$: 3.4 eV), zinc sulfide ZnS ($E_g$: 3.7 eV), and diamond ($E_g$: 3.7 eV), are effective.

Figure 21:
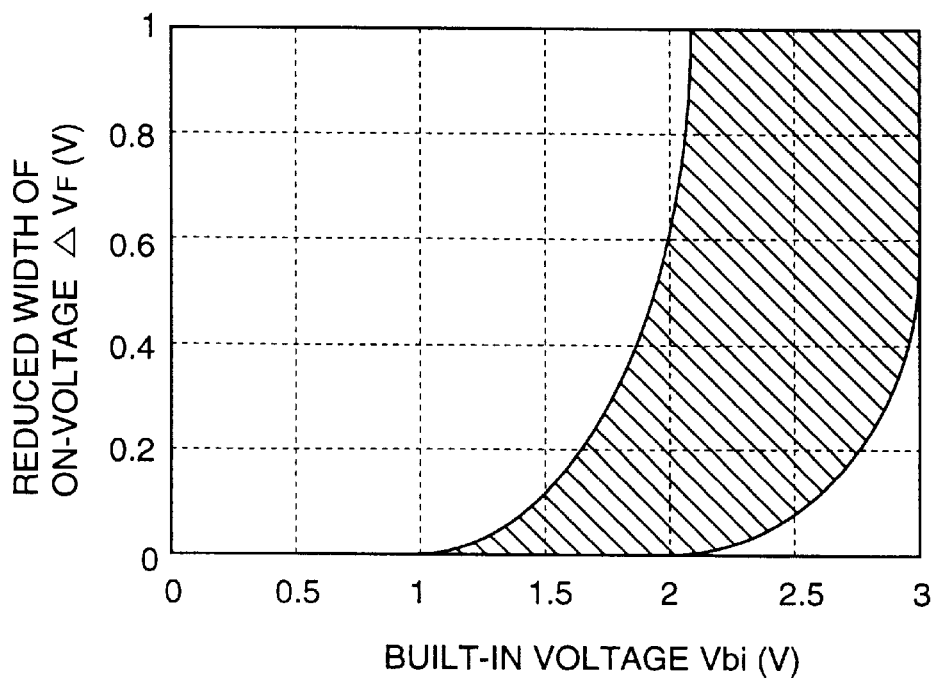
FIG. 21 shows a relation region between the built-in voltage and the reduced width of the ON voltage when the width and the depth of a channel, and the carrier concentration of a drift layer, are varied.

The relation between the reduced width of the ON voltage $\Delta V_F$ and the built-in voltage $V_{bi}$ is affected by the channel depth $X_j$, the channel width $W_{ch}$, and the impurity concentration $N_D$ of the drift layer. Thus, FIG. 21 shows the relational region between $\Delta V_F$ and $V_{bi}$, which is obtained by varying each of the above-mentioned factors, that is, by varying $X_j$ within a range of 0.5–5.0 $\mu$m, $W_{ch}$ within a range of 0.2–5.0 $\mu$m, and $N_d$ within a range of $5\times10^{14}$–$5\times10^{16}$ cm$^{-2}$. The hatched region is the relational region between $\Delta V_F$ and $V_{bi}$ corresponding to the above-mentioned ranges of the varied factors of $X_j$, $W_{ch}$, and $N_d$. From the relational region shown in FIG. 21, it is seen that the gate drive method is effective for semiconductor material having a band gap larger than 1.12 V, that is, a value of the band gap of silicon. Thus, the present invention also can be effectively applied to a SIT made of silicon.

Figure 22:
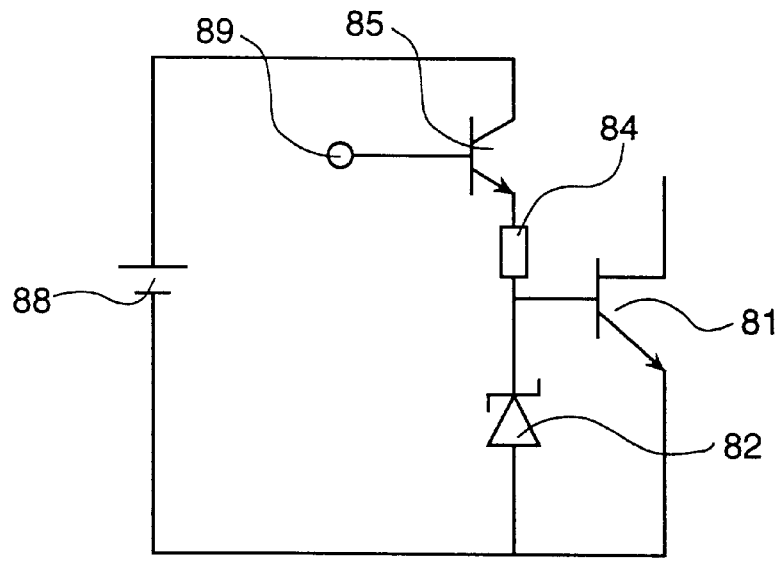
FIG. 22 is a schematic diagram showing a drive circuit for a SIT representing an embodiment according to the present invention.

FIG. 22 shows a gate drive circuit for the SIT representing an embodiment according to the present invention. This drive circuit includes a direct current power source 88, a NPN transistor 85 of which a collector terminal is connected to the positive terminal of the direct current power source 88, and a resistor 84 of which one terminal is connected to an emitter terminal of the NPN transistor 85. The other terminal of the resistor 84 is connected to a gate terminal of the SIT, and the negative terminal of the direct current power source 88 is connected to the gate terminal of the SIT. Further, a Zener diode 82 is connected between the gate and the source of the SIT. The cathode and the anode of the Zener diode 82 are connected to the gate terminal and the source terminal of the SIT, respectively. The Zener voltage of the Zener diode 82 is set to a value lower than the built-in voltage between the gate and the source of the SIT.

In the circuit shown in FIG. 22, if a turning-on demand signal is input to an input terminal 89, the NPN transistor 85 is turned on, and a turning-on forward gate bias is applied between the gate and the source of the SIT. Further, the voltage of the turning-on gate bias applied between the gate and the source of the SIT becomes lower than the built-in voltage by the Zener diode 82, and the gate drive method shown in FIG. 13B can be performed by this circuit. In FIG. 22 for explaining this embodiment, a circuit for applying a turning-off reverse gate bias is omitted.

Figure 23:
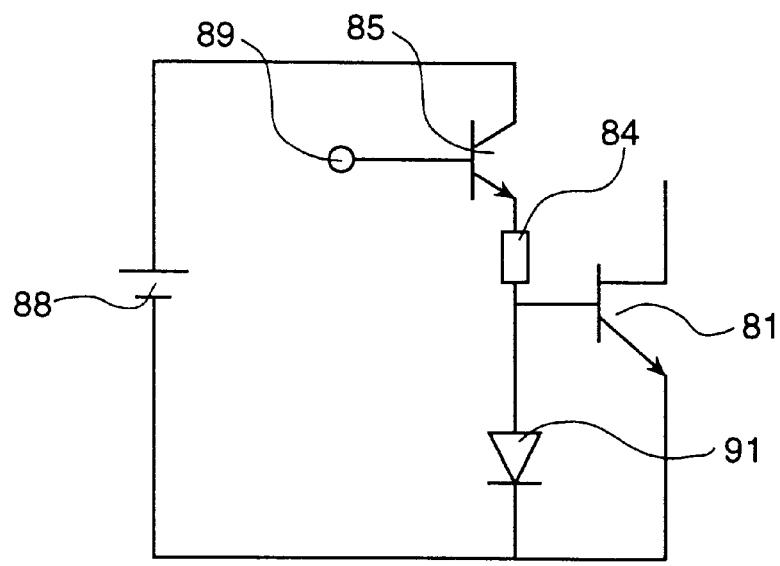
FIG. 23 is a schematic diagram showing a drive circuit for a SIT representing another embodiment according to the present invention.

FIG. 23 shows a gate drive circuit for the SIT of another embodiment according to the present invention. In FIG. 23, the Zener diode 82 of the circuit shown in FIG. 22 is replaced with a diode 91. Except for the diode 91, the circuit composition and the operation of the circuit shown in FIG. 23 are the same as those of the circuit shown in FIG. 22. However, the cathode and the anode of the diode 91 are connected to the source and the gate of the SIT, respectively. The diode 91 is composed so that its built-in voltage is lower than that between the gate and the source of the SIT. Thus, the turning-on gate bias between the gate and the source of the SIT becomes lower than the built-in voltage, and the gate drive method shown in FIG. 13B can be performed by this circuit. Moreover, in this embodiment, if the diode 91 is made of the same semiconductor material as that of the SIT, even with changes in the built-in voltages of the SIT and the diode 91, which, for example, maybe due to changes of the temperature, the level order relation between the built-in voltage of the SIT and that of the diode 91 is maintained. Thus, the operational stability against temperature changes is improved.

Figure 24A:
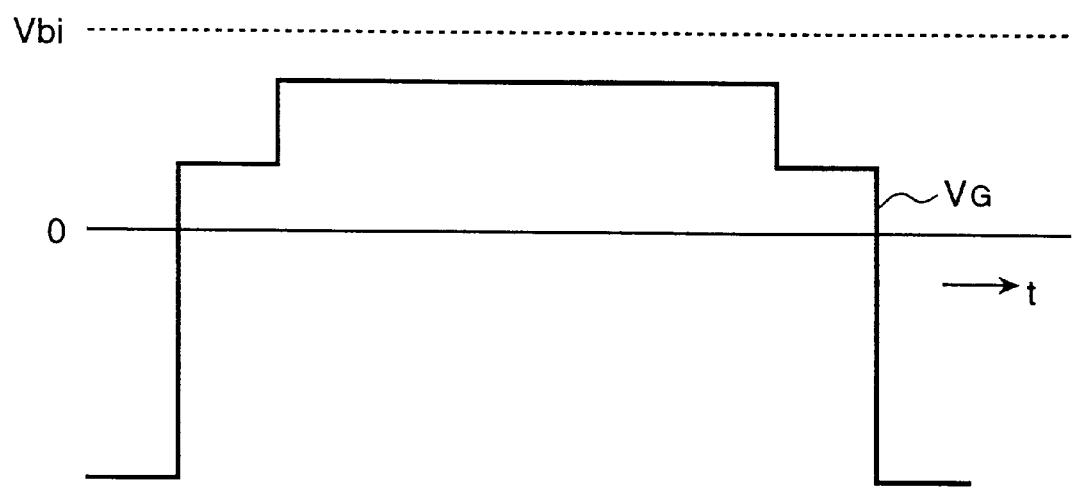
FIGS. 24A and 24B are diagrams showing drive methods of driving a SIT, according to the present invention.
Figure 24B:
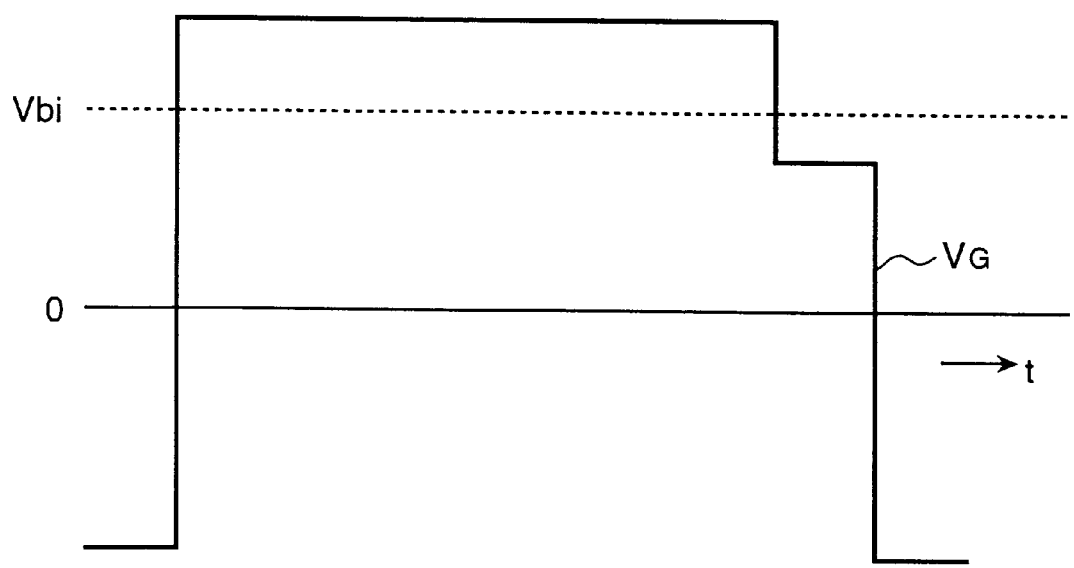

FIG. 24A and FIG. 24B shows drive methods of the SIT, for other embodiments according to the present invention. Although as the gate voltage, a gate pulse for turning-on and a gate pulse for turning-off are alternatively applied to the gate, only one gate pulse for turning-on is mainly shown in each of FIG. 24A and FIG. 24B. In FIG. 24A, the maximum voltage of the gate pulse for turning-on is lower than the built-in voltage between the gate and the source of the SIT, and the voltage $V_G$ of this gate pulse is increased or decreased, by plural steps, at a turning-on state or a turning-off state. By this method, the impedance of the SIT changes not rapidly but moderately. Therefore, it is possible to prevent the occurrence of a transient over-voltage at parasitic inductors in the circuit, or inductors in the loads. Hereupon, the number of the plural steps in changing of $V_G$ or the level height of each step can be arbitrarily set.

In the embodiment shown in FIG. 24B, by holding the voltage $V_G$ higher than $V_{bi}$ for a preset period in a steady state of the SIT after the turning-off operation, carriers are injected from the gate regions into the drift region in the SIT, which sufficiently reduces the ON voltage. Further, the voltage $V_G$ is held lower than $V_{bi}$ for another preset period right before changing of the gate pulse for the turning-off operation. By this method, since carriers accumulated in the SIT have already decreased at the time that the gate pulse for turning-off is applied to the gate, the turning-off loss can be reduced.

Figure 25:
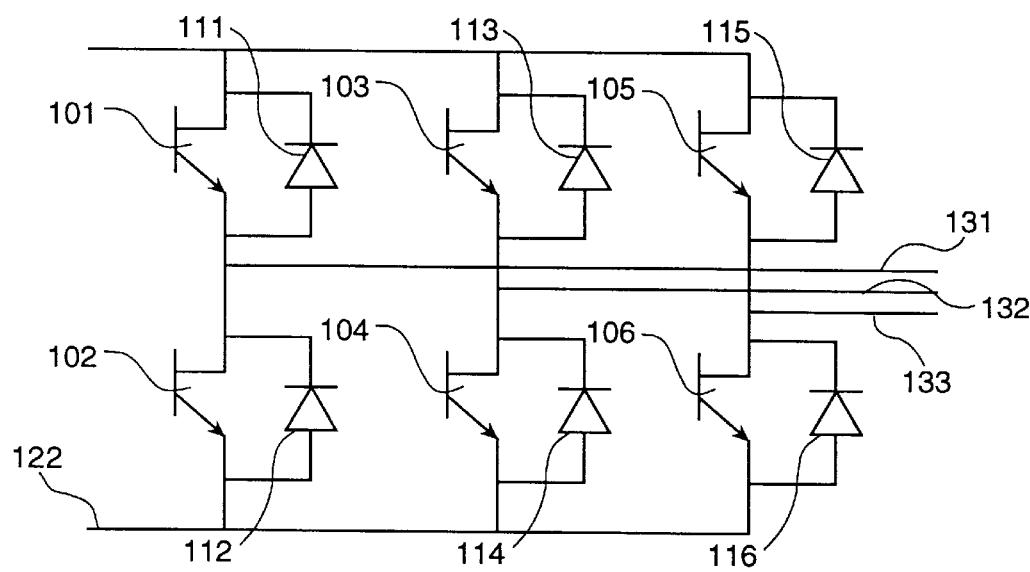
FIG. 25 is a schematic diagram which shows a main circuit of an inverter using SITs according to the present invention.

FIG. 25 shows an inverter for a power system representing an embodiment according to the present invention. This inverter includes a pair of direct current (DC) terminals 121 and 122, and three alternating current (AC) terminals 131–133 of which the number is equal to that of the phases in the AC. Further, a DC power source is connected to the pair of DC terminals 121 and 122, and by switching SITs 101–106, DC power is converted to AC power which is outputted to the AC terminals 131–133. Moreover, each of the fly-wheel diodes 111–116 is connected to the SITs 101–106 reversely in parallel. Both terminals of each of the pairs of the SITs, that is, pairs 101 and 102, 103 and 104, and 105 and 106, are connected to the respective DC terminals. From the middle connection point of each pair of the SITs, each of the AC terminals 131–133 is led out. Although omitted in FIG. 25, the SITs 101–106 are controlled by using the drive method or the drive circuit according to the present invention. In accordance with the present invention, by using the above-mentioned drive method or drive circuit, the power loss in the inverter can be reduced.

Figure 26:
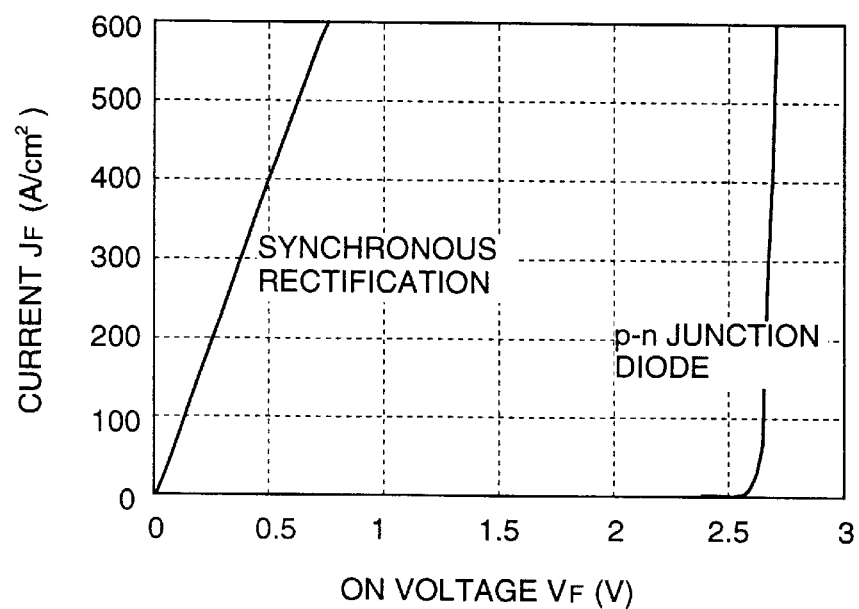
FIG. 26 is a graph which shows the forward characteristics of a synchronous rectification apparatus using SiC-SIT.

FIG. 26 shows the forward characteristics of SITs used for synchronous rectification circuits composing a rectification apparatus (AC/DC converter) in comparison with the forward characteristics of p-n junction diodes used for a rectification apparatus, which has the same withstand voltage as that of the SIT. The SITs and the p-n junction diodes are made of SiC semiconductor material. Further, the SITs are driven by the drive method or the drive circuit according to the present invention. As shown in FIG. 26, although in the p-n junction diodes of SiC, the increase of the ON voltage is small after current begins to flow, the level of the ON voltage is high because the built-in voltage $V_{bi}$ is as high as about 2.7 V. Consequently, in a rectification apparatus composed of p-n junction SiC diodes, the power loss is large. On the other hand, in accordance with the present invention, the power loss in SITs can be reduced. Moreover, since current does not flow through a p-n junction, the effect of $V_{bi}$ does not appear in the forward characteristics as shown in FIG. 26. Therefore, it is possible to realize a rectification apparatus having a low power loss.

As explained above, in accordance with the present invention, it becomes possible to drive SITs at a low ON voltage and with a low switching loss. Further, the power loss and the size of a rectification apparatus to which SITs are applied can be reduced.

What is claimed is:

1. A silicon carbide semiconductor device, comprising:
a silicon carbide substrate including a drift region of a first conductivity type, in which a gate region of a second conductivity type having a higher impurity concentration than that in said drift region and a source region of said first conductivity type extends from a surface of said silicon carbide substrate into the inside of said silicon carbide substrate, and contacts said drift region;
wherein said drift region is electrically connected to a drain electrode, a source electrode contacts said source region, a gate electrode contacts said gate region, and said source region contacts and overlaps to said gate region.

2. A silicon carbide semiconductor according to claim 1, said impurity concentration of said gate region is lower than that of said source region.

3. A silicon carbide semiconductor according to claim 1, wherein a plurality of gate regions are provided, further, said plurality of said gate regions are disposed opposite to each other across said source region, and the position at which an interval between said plurality of said gate regions opposite to each other is minimum is deeper than that of said source region in said silicon carbide substrate.

4. A silicon carbide semiconductor device according to claim 3, wherein said interval changes depending on the position in the depth direction of the gate region.

5. A silicon carbide semiconductor according to claim 3, wherein an impurity concentration in a top surface part of said gate regions is higher than that in the inside part of said gate regions.

6. A silicon carbide semiconductor according to claim 1, wherein said gate electrode is made of at least one of polysilicon, silicide, and salicide.

7. A silicon carbide semiconductor according to claim 1, wherein said drain electrode is electrically connected to said drift region through a region of said first conductivity type, of which the impurity concentration is higher than that of said drift region.

8. A silicon carbide semiconductor according to claim 1, wherein said drain electrode is electrically connected to said drift region through a region of said second conductivity type, of which the impurity concentration is higher than that of said drift region.

9. A method of driving a static induction transistor including a drain electrode, a source electrode, and a gate electrode, which are provided at a semiconductor substrate, wherein a period of keeping a forward gate bias, applied between said source electrode and said gate electrode, more than 0 V and less than a built-in voltage between said source electrode and said gate electrode, is set at an ON state.

10. A method of driving a static induction transistor according to claim 9, wherein a band gap of semiconductor material used for said semiconductor substrate is larger than that of silicon.

11. A method of driving a static induction transistor according to claim 10, wherein said band gap of semiconductor material used for said semiconductor substrate is larger than 2.4 eV.

12. A method of driving a static induction transistor according to claim 9, wherein semiconductor material used for said semiconductor substrate is one of silicon carbide, gallium nitride, and diamond.

13. A method of driving a static induction transistor according to claim 9, wherein said static induction transistor includes a plurality of semiconductor regions of a conductivity type opposite to that of said semiconductor substrate, which extend from a surface of said semiconductor substrate into said substrate, said drain electrode contacting to said semiconductor substrate, said source electrode contacting to said semiconductor substrate at a region surrounded by said plurality of said semiconductor regions, and said gate electrode contacting to said plurality of said semiconductor regions; and wherein said built-in voltage is a built-in voltage of p-n junctions of said semiconductor substrate and said plurality of said semiconductor regions.

14. A method of driving a static induction transistor according to claim 9, wherein the voltage of said gate electrode is changed by steps at an ON state.

15. A method of driving a static induction transistor according to claim 14, wherein the voltage of said gate electrode is always kept more than 0 V and less than said built-in voltage at an ON state.

16. A method of driving a static induction transistor according to claim 15, wherein the voltage of said gate electrode is increased by steps.

17. A method of driving a static induction transistor according to claim 15, wherein the voltage of said gate electrode is decreased by steps.

18. A method of driving a static induction transistor according to claim 14, wherein a period of keeping the voltage of said gate electrode more than 0 V and less than said built-in voltage, and another period of keeping the voltage of said gate electrode higher than said built-in voltage, are set at an ON state.

19. A circuit for driving a static induction transistor in which a drain electrode, a source electrode, and a gate electrode, are provided at a semiconductor substrate, said circuit comprising:
a Zener diode connected in parallel to said source electrode and said gate electrode between said source electrode and said gate electrode;
wherein the Zener voltage of said Zener diode is less than the built-in voltage between said source electrode and said gate electrode.

20. A circuit for driving a static induction transistor in which a drain electrode, a source electrode, and a gate electrode, are provided at a semiconductor substrate, said circuit comprising:
a diode connected in parallel to said source electrode and said gate electrode between said source electrode and said gate electrode;
wherein the built-in voltage of said diode is less than the built-in voltage between said source electrode and said gate electrode.

21. A circuit for driving a static induction transistor according to claim 20, wherein material forming said semiconductor substrate is the same as that forming said diode.

22. A circuit for driving a static induction transistor according to claim 21, wherein said material is one of silicon carbide, gallium nitride, and diamond.

* * * * *